(12) United States Patent
Kim et al.

(10) Patent No.: US 10,854,691 B2
(45) Date of Patent: Dec. 1, 2020

(54) DISPLAY APPARATUS WITH INTEGRATED TOUCH SCREEN AND METHOD FOR FABRICATING THE SAME

(71) Applicant: LG Display Co., Ltd., Seoul (KR)

(72) Inventors: Taehwan Kim, Bucheon-si (KR); EunHye Lee, Bucheon-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/165,714

(22) Filed: Oct. 19, 2018

(65) Prior Publication Data
US 2019/0123113 A1   Apr. 25, 2019

(30) Foreign Application Priority Data
Oct. 20, 2017  (KR) .................. 10-2017-0136807

(51) Int. Cl.
*H01L 27/32* (2006.01)
*G06F 3/041* (2006.01)
*G03F 7/16* (2006.01)
*G03F 7/20* (2006.01)
*H01L 51/52* (2006.01)
*G06F 3/044* (2006.01)

(52) U.S. Cl.
CPC ............ *H01L 27/323* (2013.01); *G03F 7/16* (2013.01); *G03F 7/20* (2013.01); *G06F 3/0412* (2013.01); *G06F 3/0443* (2019.05); *G06F 3/04164* (2019.05); *H01L 51/5253* (2013.01); *G06F 2203/04103* (2013.01); *G06F 2203/04111* (2013.01); *G06F 2203/04112* (2013.01); *H01L 27/3244* (2013.01); *H01L 2227/323* (2013.01)

(58) Field of Classification Search
CPC .............. H01L 27/323; H01L 27/5253; G06F 3/04164; G06F 3/0443; G06F 3/0412; G03F 7/16; G03F 7/20
USPC ................... 345/173, 174, 178; 257/740
See application file for complete search history.

(56) References Cited

U.S. PATENT DOCUMENTS

2008/0186288 A1* 8/2008 Chang ............... G06F 3/0412
                                                    345/174
2009/0167703 A1* 7/2009 You .................. G06F 3/045
                                                    345/173
2010/0265206 A1* 10/2010 Chen ................ G06F 3/0412
                                                    345/174

(Continued)

*Primary Examiner* — Prabodh M Dharia
(74) *Attorney, Agent, or Firm* — Birch, Stewart, Kolasch & Birch, LLP

(57) ABSTRACT

A display apparatus and a method for fabricating the same are discussed, in which bridge electrodes can be connected with touch electrodes even without a separate mask process. The display apparatus comprises a light emitting device layer that includes a first electrode arranged on a first substrate, a light emitting layer arranged on the first electrode, and a second electrode arranged on the light emitting layer; and a touch sensing layer arranged on the light emitting device layer, wherein the touch sensing layer includes first and second touch electrode layers and a touch insulating film arranged between the first and second touch electrode layers, and the first touch electrode layer constitutes first and second touch electrodes, and the second touch electrode layer constitutes bridge electrodes and is formed to be filled in a contact hole provided in the touch insulating film and connected with the first touch electrode layer.

16 Claims, 12 Drawing Sheets

(56) References Cited

U.S. PATENT DOCUMENTS

| | | | |
|---|---|---|---|
| 2012/0188184 A1* | 7/2012 | Lin | G06F 3/03547 |
| | | | 345/173 |
| 2012/0200815 A1* | 8/2012 | You | G02F 1/1337 |
| | | | 349/123 |
| 2012/0268402 A1* | 10/2012 | Wang | G06F 3/041 |
| | | | 345/173 |
| 2013/0154979 A1* | 6/2013 | Li | G06F 3/044 |
| | | | 345/173 |
| 2013/0307800 A1* | 11/2013 | Cheng | G06F 3/0412 |
| | | | 345/173 |
| 2014/0320761 A1* | 10/2014 | Misaki | G06F 3/044 |
| | | | 349/12 |
| 2016/0328058 A1* | 11/2016 | Peng | H01L 27/1222 |
| 2017/0205928 A1* | 7/2017 | Noguchi | G06F 3/04166 |
| 2018/0013086 A1* | 1/2018 | Chou | H01L 51/5012 |
| 2018/0026225 A1* | 1/2018 | Kwon | H01L 51/5237 |
| | | | 257/40 |
| 2018/0197924 A1* | 7/2018 | Tada | H01L 27/323 |
| 2018/0204886 A1* | 7/2018 | Lee | H01L 51/5281 |
| 2018/0239489 A1* | 8/2018 | Song | G06F 3/04164 |
| 2018/0287092 A1* | 10/2018 | Song | H01L 51/0097 |
| 2018/0329537 A1* | 11/2018 | Gunji | G06F 3/0418 |
| 2019/0044270 A1* | 2/2019 | Miyamura | H01R 13/10 |
| 2019/0272057 A1* | 9/2019 | Chen | G06F 3/0416 |

\* cited by examiner

DISPLAY APPARATUS WITH INTEGRATED TOUCH SCREEN AND METHOD FOR FABRICATING THE SAME

CROSS REFERENCE TO RELATED APPLICATIONS

This application claims the priority benefit of the Korean Patent Application No. 10-2017-0136807 filed on Oct. 20, 2017 in the Republic of Korea, which is hereby incorporated by reference for all purposes as if fully set forth herein.

BACKGROUND OF THE INVENTION

Field of the Invention

The present invention relates to a display apparatus with an integrated touch screen and a method for fabricating the same.

Discussion of the Related Art

With the advancement of the information age, a demand for a display apparatus for displaying images has been increased in various forms. Therefore, various display apparatuses such as liquid crystal display (LCD) apparatuses, plasma display panel (PDP) apparatuses, and organic light emitting display (OLED) apparatuses have been used. Among the display apparatuses, the OLED apparatus has advantages of low-voltage driving, thin profile, excellent viewing angle, and rapid response speed.

The OLED apparatus can include a display panel having data lines, scan lines, and a plurality of pixels provided at every intersection of the data and scan lines, a scan driver for supplying scan signals to the scan lines, and a data driver for supplying data voltages to the data lines. Each of the pixels can include an organic light emitting device, a driving transistor for controlling the amount of current supplied to the organic light emitting device in accordance with a voltage of a gate electrode, and a scan transistor for supplying a data voltage of the data line to the gate electrode of the driving transistor in response to a scan signal of the scan line.

The display apparatus can be formed as a display apparatus with an integrated touch screen, which includes a touch screen panel for sensing a user's touch. In this case, the display apparatus functions as a touch screen apparatus. The touch screen apparatus may be widely applied to home appliances such as a refrigerator, a microwave oven and a washing machine, as well as monitors for navigation, an industrial terminal, a notebook computer, a banking automation apparatus and a game console and mobile terminals such as a smart phone, tablet, mobile phone, MP3, PDA, PMP, PSP, mobile game console, DMB receiver and tablet PC. Also, the touch screen apparatus has become widely used due to its easy operation.

In the display apparatus with an integrated touch screen, first touch electrodes, second touch electrodes, and bridge electrodes for connecting the first touch electrodes or the second touch electrodes with each other are formed in the display panel. The first touch electrodes can be Tx electrodes, and the second touch electrodes can be Rx electrodes.

The bridge electrodes and the first and second electrodes of the display apparatus with an integrated touch screen are formed at their respective layers different from each other. Therefore, a separate mask process is needed and additionally performed to connect the bridge electrodes with the first and second electrodes, which may render the fabrication process complex and costly.

SUMMARY OF THE INVENTION

Accordingly, the present invention is directed to a display apparatus with an integrated touch screen and a method for fabricating the same, which substantially obviate one or more problems due to limitations and disadvantages of the related art.

An advantage of the present invention is to provide a display apparatus with an integrated touch screen and a method for fabricating the same, in which bridge electrodes can be connected with touch electrodes even without a separate mask process.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

A display apparatus according to one embodiment of the present invention comprises a light emitting device layer that includes a first electrode arranged on a first substrate, a light emitting layer arranged on the first electrode, and a second electrode arranged on the light emitting layer; and a touch sensing layer arranged on the light emitting device layer, wherein the touch sensing layer includes first and second touch electrode layers and a touch insulating film arranged between the first and second touch electrode layers, and the first touch electrode layer constitutes first and second touch electrodes, and the second touch electrode layer constitutes bridge electrodes and is formed to be filled in a contact hole provided in the touch insulating film and connected with the first touch electrode layer.

In another aspect of the present invention, a method for fabricating a display apparatus comprises forming a thin film transistor layer, a light emitting device layer, and an encapsulation layer on a first substrate; forming a second touch electrode layer, which includes bridge electrodes, on the encapsulation layer and then forming a touch insulating film, which includes a touch inorganic film and a touch organic film, on the second touch electrode layer; forming a first touch electrode layer, which includes first touch electrodes and second touch electrodes, on the touch insulating film and forming a photoresist layer and then exposing the photoresist layer; etching the touch insulating film, the first touch electrode layer and the second touch electrode layer; and growing the bridge electrodes and connecting the bridge electrodes with the first touch electrode layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Figure 1:
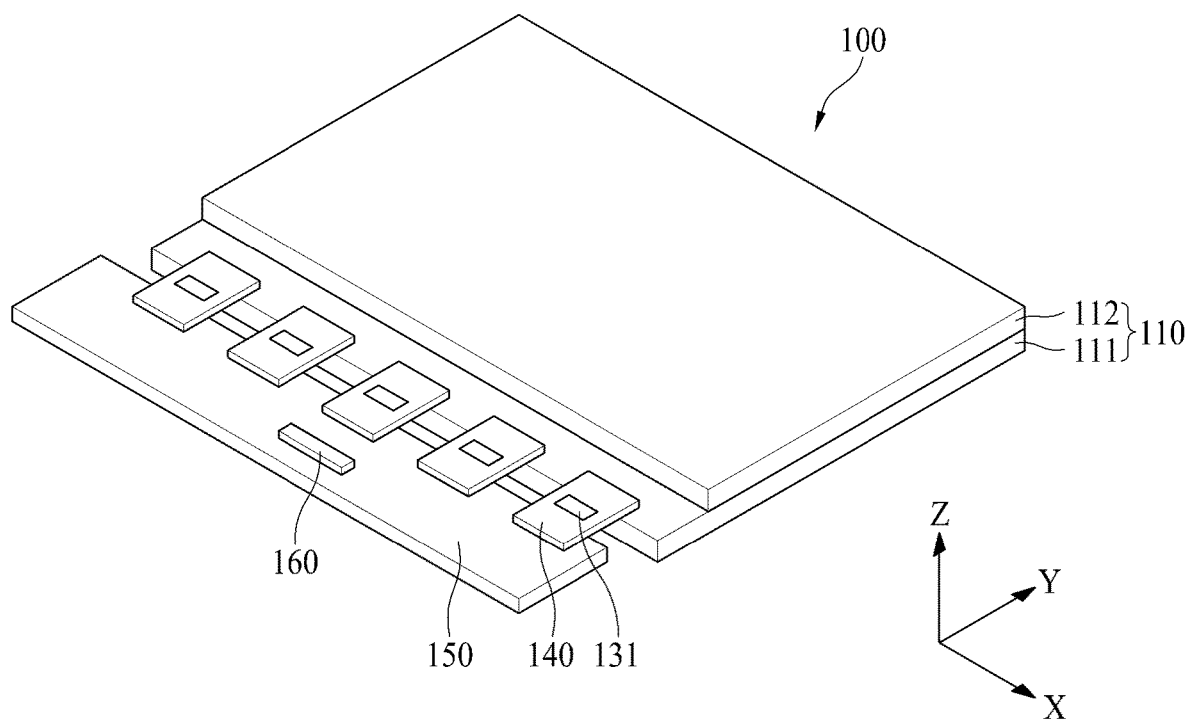
FIG. 1 is a perspective view illustrating a display apparatus with an integrated touch screen according to one embodiment of the present invention.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Further, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout the specification. In the following description, when the detailed description of the relevant known function or configuration is determined to unnecessarily obscure the important point of the present invention, the detailed description will be omitted.

In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~', 'above~', 'below~', and 'next to~', one or more portions may be arranged between two other portions unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another element. For example, a first element could be termed a second element, and, similarly, a second element could be termed a first element, without departing from the scope of the present invention.

"A first horizontal-axis direction", "a second horizontal-axis direction" and "a vertical-axis direction" should not be construed by a geometric relation only of a mutual vertical relation, and may have broader directionality within the range that elements of the present invention may act functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, the preferred embodiments of the present invention will be described in detail with reference to the accompanying drawings. Wherever possible, the same reference numbers will be used throughout the drawings to refer to the same or like parts.

Figure 2:
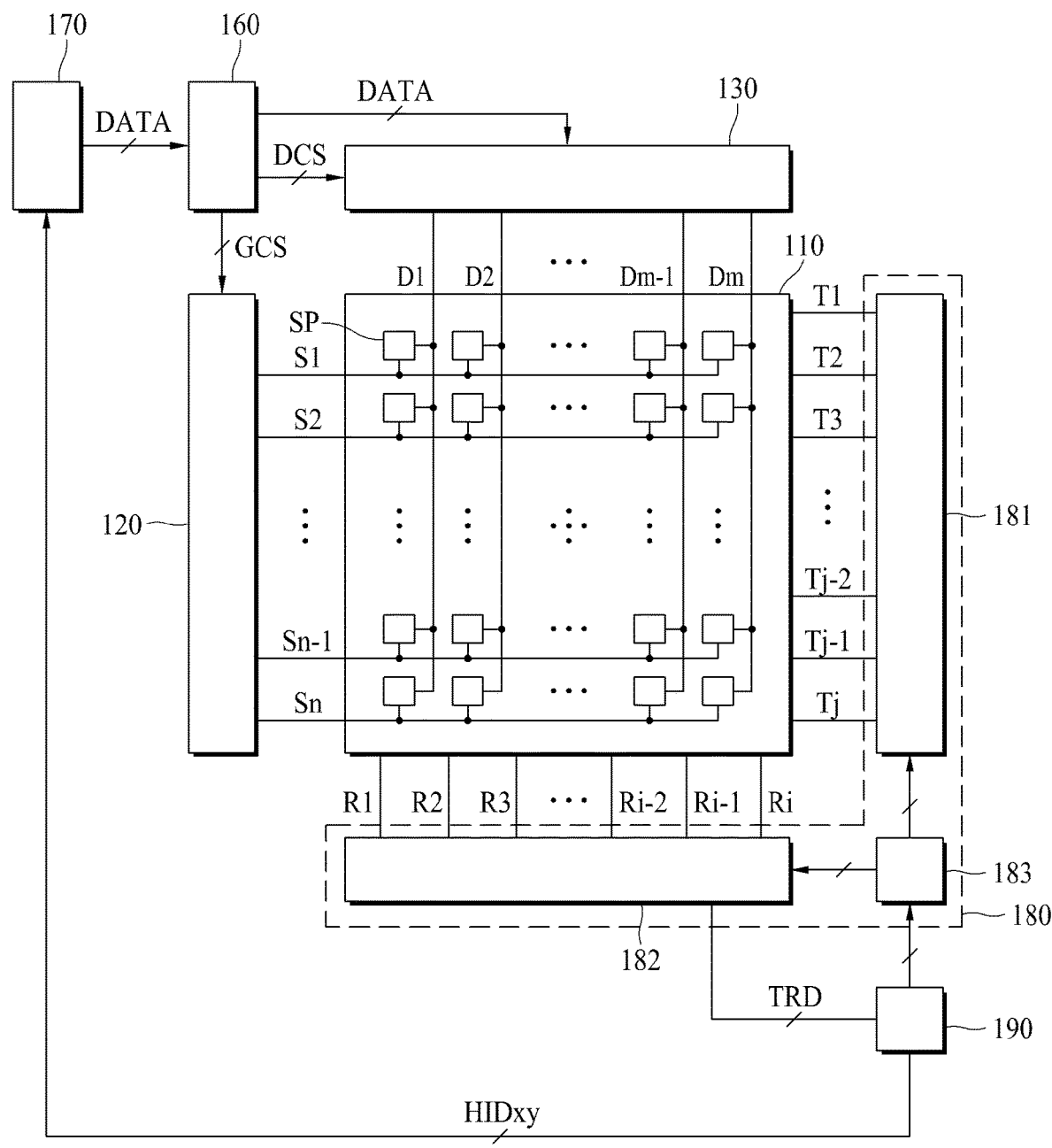
FIG. 2 is a block view illustrating a display apparatus with an integrated touch screen according to one embodiment of the present invention.

FIG. 1 is a perspective view illustrating a display apparatus with an integrated touch screen according to one embodiment of the present invention. FIG. 2 is a block view illustrating a display apparatus with an integrated touch screen according to one embodiment of the present invention. All the components of the display apparatus with the integrated touch screen according to all embodiments of the present invention are operatively coupled and configured.

Referring to FIGS. 1 and 2, the display apparatus with an integrated touch screen according to the embodiment of the present invention includes a display panel 110, a scan driver 120, a data driver 130, a timing controller 160, a host system 170, a touch driver 180, and a touch coordinate calculator 190.

The display apparatus with an integrated touch screen according to the embodiments of the present invention can be realized as a flat panel display apparatus such as a Liquid Crystal Display (LCD), Field Emission Display (FED), Plasma Display Panel (PDP), Organic Light Emitting Display (OLED), and Electrophoresis display (EPD). Hereinafter, the display apparatus with an integrated touch screen according to the present invention is realized as, but not limited to, an organic light emitting display apparatus.

The display panel 110 includes a first substrate 111 and a second substrate 112. The second substrate 112 can be an encapsulation substrate. The first substrate can be a plastic film or a glass substrate. The second substrate 112 can be a plastic film, a glass substrate, or an encapsulation film (protective film).

The display panel 110 includes a display area on which sub pixels SP are arranged to display an image. On the display area 110, data lines D1 to Dm (m is a positive integer of 2 or more) and scan lines S1 to Sn (n is a positive integer of 2 or more) are formed. The data lines D1 to Dm can be formed to cross the scan lines S1 to Sn. The sub pixels SP can be formed on the area defined by a crossed structure of the gate lines and the data lines.

Each of the sub pixels SP of the display panel 110 can be connected to any one of the data lines D1 to Dm and any one of the scan lines S1 to Sn. Each of the sub pixels SP of the display panel 110 can include a driving transistor for controlling a drain-source current in accordance with a data voltage applied to a gate electrode, a scan transistor turned on by a scan signal of the scan line, supplying a data voltage of the data line to the gate electrode of the driving transistor, an organic light emitting diode for emitting light in accordance with the drain-source current of the driving transistor, and a capacitor for storing a voltage of the gate electrode of the driving transistor. Therefore, each of the sub pixels SP can emit light in accordance with the current supplied to the organic light emitting diode.

The scan driver 120 receives a scan control signal GCS from the timing controller 160. The scan driver 120 supplies scan signals to the scan lines S1~Sn in accordance with the scan control signal GCS.

The scan driver 120 can be formed in a non-display area outside one side or both sides of the display area of the display panel 110 in a GIP (gate driver in panel) mode. Alternatively, the scan driver 120 is fabricated of a driving chip, packaged in a flexible film, and can be attached to the non-display area outside one side or both sides of the display area of the display panel 110 in a TAB (tape automated bonding) mode.

The data driver 130 receives digital video data DATA and a data control signal DCS from the timing controller 160. The data driver 130 converts the digital video data DATA into an analogue positive polarity/negative polarity data voltage in accordance with the data control signal DCS and supplies them to the data lines. For example, pixels to which the data voltages will be supplied are selected by the scan signals of the scan driver 120, and the data voltages are supplied to the selected pixels.

The data driver 130 can include a plurality of source drive ICs 131 as shown in FIG. 1. Each of the plurality of source drive ICs 131 can be packaged into the flexible film 140 in a COF (chip on film) or COP (chip on plastic) mode. The flexible film 140 is attached onto pads provided on the non-display area of the display panel 110 using an anisotropic conducting film, whereby the source drives ICs 131 can be connected to the pads.

The circuit board 150 can be attached to the flexible films 140. A plurality of circuits realized as driving chips can be packaged onto the circuit board 150. For example, the timing controller 160 can be packaged onto the circuit board 150. The circuit board 150 can be a printed circuit board or flexible printed circuit board.

The timing controller 160 receives digital video data DATA and timing signals from the host system 170. The timing signals can include a vertical synchronization signal, a horizontal synchronization signal, a data enable signal, and a dot clock. The vertical synchronization signal is a signal defining one frame period. The horizontal synchronization signal is a signal defining one horizontal period needed to supply the data voltages to pixels of one horizontal line of the display panel DIS. The data enable signal is a signal defining a period of inputting available data. The dot clock is a signal repeated with a predetermined short period.

In order to control operation timings of the scan driver 120 and the data driver 130, the timing controller 160 generates a data control signal DCS for controlling operation timing of the data driver 130 and a scan control signal GCS for controlling operation timing of the data driver 130 based on the timing signals. The timing controller 160 outputs the scan control signal GCS to the scan driver 120 and outputs the digital video data DATA and the data control signal DCS to the data driver 130.

The host system 170 can be realized as a navigation system, a set-top box, a DVD player, a blue-ray player, a personal computer (PC), a home theater system, a broadcasting receiver, and a phone system. The host system 170 includes SoC (System on chip) equipped with a scaler and converts the digital video data of an input image to a format suitable to display the display panel 110. The host system 170 transmits the digital video data DATA and the timing signals to the timing controller 160.

On the display panel 110, not only the data lines D1 to Dm and the scan lines S1 to Sn but also first and the second touch electrodes can be formed. The first touch electrodes can be formed to cross the second touch electrodes. The first touch electrodes can be connected to a first touch driver 181 through first touch lines T1 to Tj, where j is an integer equal to or greater than 2. The second touch electrodes can be connected to a second touch driver 182 through second touch lines R1 to Ri, where i is an integer equal to or greater than 2. On each of the intersections between the first touch electrodes and the second touch electrodes, a touch sensor can be formed. The touch sensor according to the embodiment of the present invention is realized as, but not limited to, a mutual capacitance. The first and the second touch electrodes will be described later in more detail with reference to FIGS. 4 and 5.

The touch driver 180 supplies a driving pulse to the first touch electrodes through the first touch lines T1 to Tj and senses the amount of charge changes in each of the touch sensors through the second touch lines R1 to Ri. That is, in FIG. 2, description will be given based on that the first touch lines T1 to Tj are Tx lines for supplying a driving pulse and the second touch lines R1 to Ri are Rx lines for sensing the amount of charge changes in in each of the touch sensors.

The touch driver 180 includes the first touch driver 181, the second touch driver 182, and a touch controller 183. The first touch driver 181, the second touch driver 182, and the touch controller 183 can be integrated into one ROIC (Read-out IC).

The first touch driver 181 selects the first touch line to output a driving pulse under the control of the touch controller 183 and supplies the driving pulse to the selected first touch line. For example, the first touch driver 181 can sequentially supply driving pulses to the first touch lines T1 to Tj.

The second touch driver 182 selects the second touch lines to receive the amount of charge changes in the touch sensors under the control of the touch controller 183 and receives the amount of charge changes in the touch sensors through the selected second touch lines. The second touch driver 182 converts the amount of charge changes in the touch sensors, which are received through the second touch lines R1 to Ri, to touch raw data TRD which is digital data by sampling the amount of charge changes in the touch sensors.

The touch controller 183 can generate a Tx setup signal in the first touch driver 181 to set up the first touch line to which the driving pulse is to be output and an Rx setup signal in the second touch driver 182 to set up the second touch line in which a touch sensor voltage is to be received. Also, the touch controller 183 generates timing control signals to control operation timings of the first touch driver 181 and the second touch driver 182.

The touch coordinate calculator 190 receives touch raw data TRD from the touch driver 180. The touch coordinate calculator 190 calculates touch coordinate(s) in accordance with a touch coordinate calculating method and outputs touch coordinate data HIDxy including information of touch coordinate(s) to the host system 170.

The touch coordinate calculator 190 can be realized as a Micro Controller Unit (MCU). The host system 170 analyzes touch coordinate data HIDxy input from the touch coordinate calculator 190 and executes an application program connected with a coordinate where a touch is generated by a user. The host system 170 transmits the digital video data DATA and the timing signals to the timing controller 160 in accordance with the executed application program.

The touch driver 180 can be included in the source drive ICs 131 or can be fabricated of a separate drive chip and packaged onto the circuit board 150. Also, the touch coordinate calculator 190 can be fabricated of a driving chip and packaged onto the circuit board 150

Figure 3:
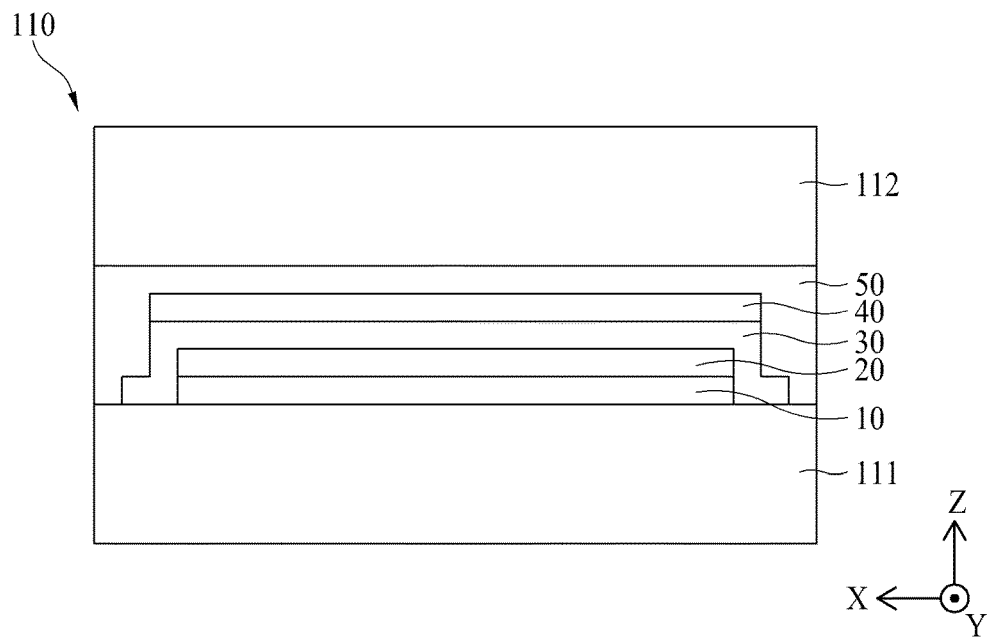
FIG. 3 is a cross-sectional view illustrating one side of a display panel of FIG. 2.

FIG. 3 is a cross-sectional view illustrating one side of the display panel 110 in FIG. 2.

Referring to FIG. 3, the display panel 110 can include a first substrate 111, a second substrate 112, a thin film transistor layer 10 arranged between the first and second substrates 111 and 112, an light emitting device layer 20, an encapsulation layer 30, a touch sensing layer 40, and an adhesive layer 50.

The first substrate 111 can be a plastic film or a glass substrate.

The thin film transistor layer 10 is formed on the first substrate 111. The thin film transistor layer 10 can include scan lines, data lines, and thin film transistors. Each of the thin film transistors includes a gate electrode, a semiconductor layer, and source and drain electrodes. In the case that a scan driver is formed using a GIP (gate driver in panel) method, the scan driver can be formed together with the thin film transistor layer 10. A detailed description of the thin film transistor 10 will be given later with reference to FIGS. 6 and 7.

The light emitting device layer 20 is formed on the thin film transistor 10. The light emitting device layer 20 includes first electrodes, an organic light emitting layer, a second electrode, and banks. Each of the organic light emitting layers can include a hole transporting layer, an organic light emitting layer, and an electron transporting layer. In this case, when a voltage is applied to the first electrode and the second electrode, holes and electrons are moved to the light emitting layer through the hole transporting layer and the electron transporting layer, respectively and are combined in the organic light emitting layer, thereby emitting light. The light emitting device layer 20 can be a pixel array layer where pixels are formed, whereby the area where the light emitting device layer 20 is formed can be defined as the display area. An area in the periphery of the display area can be defined as the non-display area. A detailed description of the light emitting device layer 20 will be given later with reference to FIGS. 6 and 7.

The encapsulation layer 30 is formed on the light emitting device layer 20. The encapsulation layer 30 serves to prevent oxygen or water from being permeated into the light emitting device layer 20. The encapsulation layer 30 can include at least one inorganic film and at least one organic film. A sectional structure of the encapsulation layer 30 will be described later in detail with reference to FIGS. 6 and 7.

The touch sensing layer 40 is formed on the encapsulation layer 30. The touch sensing layer 40 can include first and the second touch electrode layers for sensing a touch of a user. The first touch electrode layer can include first touch electrodes connected to the first touch lines T1 to Tj and second touch electrodes connected to the second touch lines R1 to Ri. The second touch electrode layer can include bridge electrodes for mutually connecting the first touch electrodes or the second touch electrodes. In the embodiment of the present invention, the touch sensing layer for sensing the touch of the user is formed on the encapsulation layer 30, whereby the touch screen apparatus does not need to be separately attached on the display apparatus. A plane structure of the touch sensing layer 40 will be described later with reference to FIGS. 4 and 5. Also, a sectional structure of the touch sensing layer 40 will be described later with reference to FIGS. 6 and 7.

The adhesive layer 50 is formed on the touch sensing layer. The adhesive layer 50 adheres the first substrate 111 and the second substrate 112 to each other, which are provided with the thin film transistor 10, the light emitting device layer 20, the encapsulation layer 30 and the touch sensing layer 40. The adhesive layer 50 can be an optically clear resin (OCR) or an optically clear adhesive film (OCA).

The second substrate 112 serves as a cover substrate or cover window for covering the first substrate 110. The second substrate 112 can be a plastic film, a glass substrate, or an encapsulation film (protective film).

Figure 4:
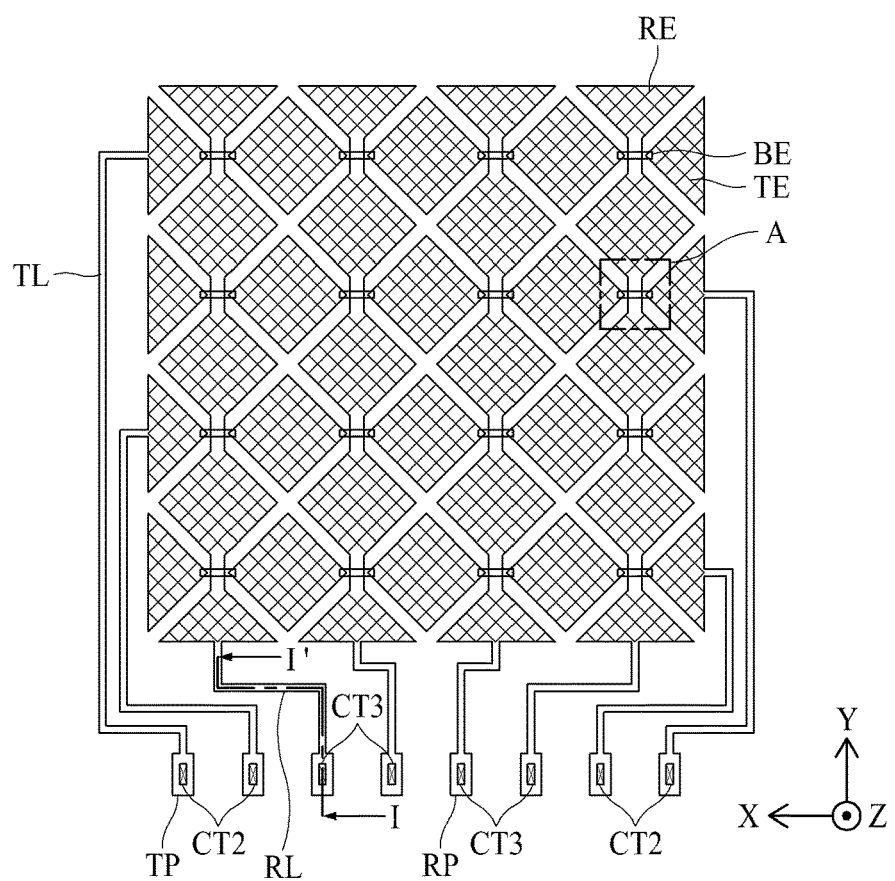
FIG. 4 is a plane view illustrating first and second touch electrodes, bridge electrodes and first and second touch lines of a display apparatus with an integrated touch screen according to one embodiment of the present invention.

FIG. 4 is a plane view illustrating first and second touch electrodes, bridge electrodes and first and second touch lines of a display apparatus with an integrated touch screen according to one embodiment of the present invention.

Referring to FIG. 4, the first touch electrodes TE can be arranged in a first direction (e.g., x-axis direction), and the second touch electrodes RE can be arranged in a second direction (e.g., y-axis direction) crossing the first direction (x-axis direction). The first direction (x-axis direction) can be parallel with the scan lines S1 to Sn, and the second direction (y-axis direction) can be parallel with the data lines D1 to Dm. Alternatively, the first direction (x-axis direction) can be parallel with the data lines D1 to Dm, and the second direction (y-axis direction) can be parallel with the scan lines S1 to Sn. Although FIG. 4 illustrates that the first touch electrodes TE and the second touch electrodes RE have a diamond shaped plane structure, it is to be understood that the present invention is not limited to the example of FIG. 4 and encompasses other variations.

The first touch electrodes TE adjacent to each other in the first direction (x-axis direction) can electrically be connected with each other through the bridge electrode BE to prevent the first touch electrodes TE and the second touch electrodes RE from being shorted at their crossed areas. Mutual capacitance corresponding to the touch sensor can be formed on the crossed area of the first touch electrode TE and the second touch electrode RE.

Also, since each of the first touch electrodes TE connected in the first direction (x-axis direction) is spaced apart from the first touch electrodes TE adjacent thereto in the second direction (y-axis direction), the first touch electrodes are electrically insulated from each other. Since each of the second touch electrodes RE connected in the second direction (y-axis direction) is spaced apart from the second touch electrodes RE adjacent thereto in the first direction (x-axis direction), the second touch electrodes are electrically insulated from each other.

Among the first touch electrodes TE connected with each other in the first direction (x-axis direction), the first touch electrode TE arranged at one end can be connected with the first touch line TL. The first touch line TL can be connected to the first touch driver 181 through a first touch pad TP. Therefore, the first touch electrodes TE connected with each other in the first direction (x-axis direction) can receive a touch driving signal from the first touch driver 181 through the first touch line TL.

Among the second touch electrodes RE connected with each other in the second direction (y-axis direction), the second touch electrode RE arranged at one end can be connected to the second touch line RL. The second touch line RL can be connected to the second touch driver 182 through a second touch pad RP. Therefore, the second touch driver 182 can receive the amount of charge changes in the touch sensors of the second touch electrodes RE connected with each other in the second direction (y-axis direction).

Figure 5:
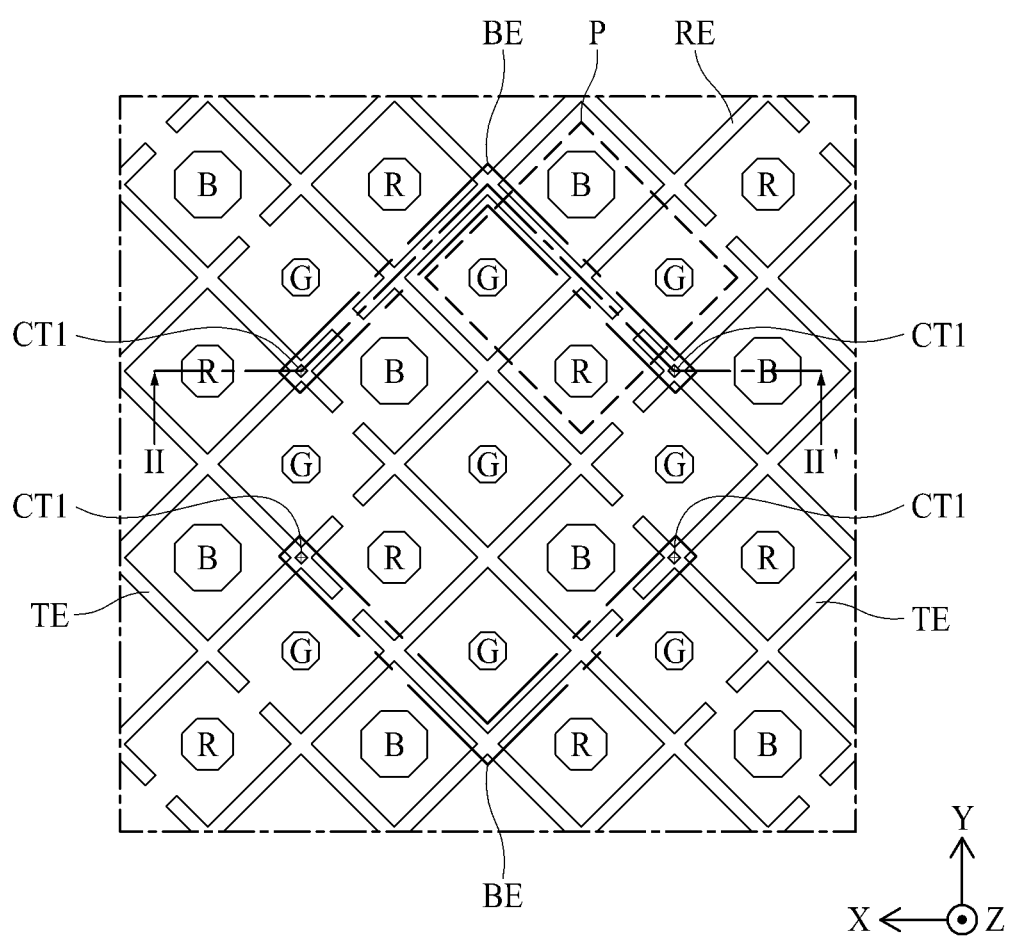
FIG. 5 is an enlarged view illustrating an area A of FIG. 4.

FIG. 5 is an enlarged view illustrating an area A of FIG. 4.

Referring to FIG. 5, pixels P can be formed in a pentile structure. Each of the pixels P includes a plurality of sub pixels SP, and for example, can include one red pixel R, two green pixels G, and one blue pixel B as shown in FIG. 5. The red pixel R, the two green pixels G and the blue pixel B can be formed in an octagonal plane shape. Also, among the red pixel R, the two green pixels G and the blue pixel B, the blue pixel B can be the largest, and the green pixel(s) G can be the smallest. Although FIG. 5 illustrates that the pixels are formed in the pentile structure, the embodiment of the present invention is not limited to the example of FIG. 5 and includes other variations.

The first touch electrodes TE and the second touch electrodes RE can be formed in a mesh structure to be prevented from being overlapped with the red pixel R, the green pixels G and the blue pixel B of each of the pixels P. For example, the first touch electrodes TE and the second touch electrodes RE can be formed on a bank provided among the red pixel R, the green pixels G and the blue pixel G.

The first touch electrodes TE adjacent to each other in the first direction (x-axis direction) can be connected with each other through a plurality of bridge electrodes BE. Each of the bridge electrodes BE can be connected to the first touch electrodes TE adjacent to each other through a first connector CNT1 for exposing the first touch electrodes TE1. The bridge electrodes BE can be overlapped with the first touch electrode TE and the second touch electrode RE. The bridge electrode BE can be formed on the bank provided among the red pixel R, the green pixels G and the blue pixel B.

The first touch electrodes TE and the second touch electrodes RE can be formed on the same layer, and the bridge electrode BE can be formed on a layer different from the first touch electrodes TE and the second touch electrodes RE.

Figure 6:
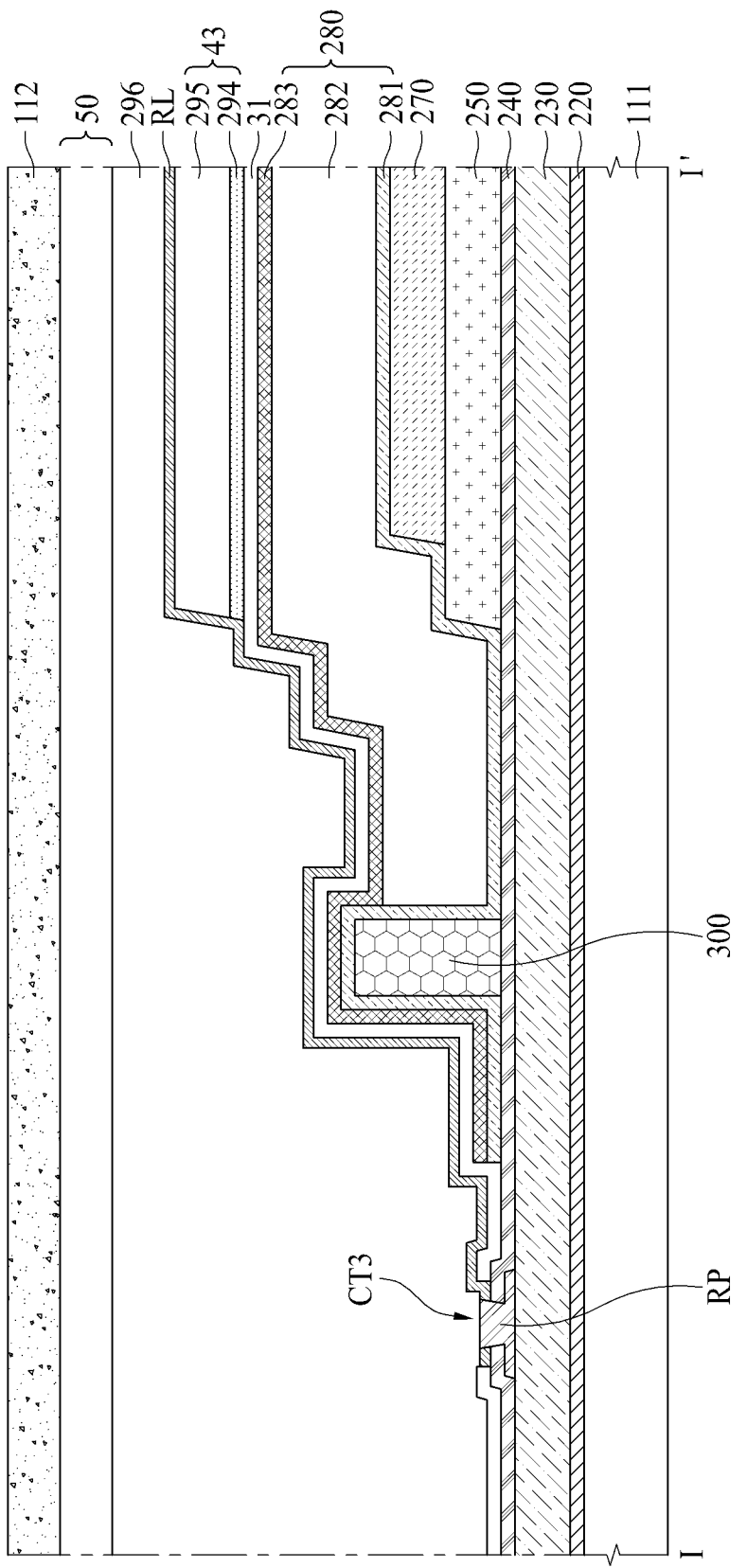
FIG. 6 is a cross-sectional view illustrating an example of an area along line I-I' of FIG. 4.
Figure 7:
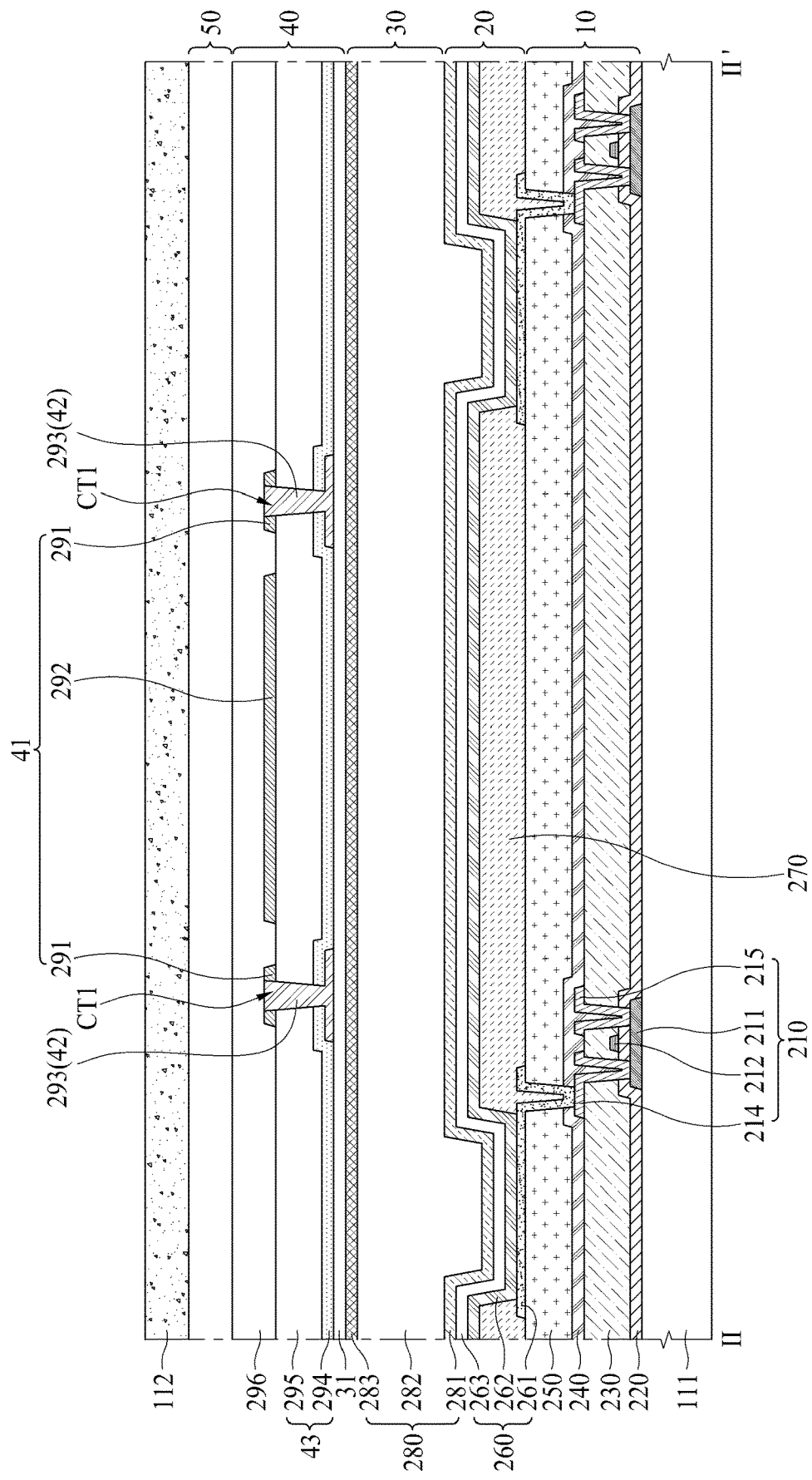
FIG. 7 is a cross-sectional view illustrating an example of an area along line II-IF of FIG. 5.

FIG. 6 is a cross-sectional view illustrating an example of an area along line I-I' of FIG. 4. FIG. 7 is a cross-sectional view illustrating an example of an area along line II-II' of FIG. 5.

A detailed connection structure of the second touch line RL and the second touch pad RP is shown in FIG. 6, and a detailed connection structure between the bridge electrode BE and the first touch electrodes TE is shown in FIG. 7.

Referring to FIGS. 6 and 7, the thin film transistor layer 110 is formed on the first substrate 111. The thin film transistor 110 includes thin film transistors 210, first and second touch pads TP and RP, a gate insulating film 220, an inter-layer dielectric film 230, a passivation film 240, and a planarization film 250.

A first buffer film can be formed on one surface of the first substrate 111. The first buffer film can be formed on one surface of the first substrate 111 to protect the thin film transistors 210 and organic light emitting devices 260 from water permeated through the first substrate 111 which is vulnerable to moisture permeability. One surface of the first substrate 111 can be a surface facing the second substrate 112. The first buffer film can be made of a plurality of inorganic films which are deposited alternately. For example, the first buffer film can be formed of a multi-layered film of one or more inorganic films of a silicon oxide film (SiOx), a silicon nitride film (SiNx) and SiON, which are deposited alternately. The first buffer film can be omitted.

The thin film transistor 210 is formed on the first buffer film. The thin film transistor 210 includes an active layer 211, a gate electrode 212, a source electrode 213, and a drain electrode 214. Although the thin film transistor 210 is formed in a top gate mode in which the gate electrode 212 is arranged above the active layer 211 as shown in FIG. 7, it is to be understood that the thin film transistor of the present invention is not limited to the top gate mode. That is, the thin film transistor 210 can be formed in a bottom gate mode in which the gate electrode 212 is arranged below the active layer 211 or a double gate mode in which the gate electrode 212 is arranged above and below the active layer 211.

The active layer 211 is formed on the first buffer film. The active layer 211 can be formed of a silicon based semiconductor material or an oxide based semiconductor material. A light-shielding layer for shielding external light entering the active layer 211 can be formed between the first buffer film and the active layer 211.

The gate insulating film 220 can be formed on the active layer 211. The gate insulating film 220 can be formed of an inorganic film, for example, a silicon oxide film (SiOx), a silicon nitride film (SiNx) or a multi-layered film of the silicon oxide film and the silicon nitride film.

The gate electrode 212 and the gate line can be formed on the gate insulating film 220. The gate electrode 212 and the gate line can be formed of a single layer or multi-layer comprised of any one of Mo, Al, Cr, Au, Ti, Ni, Nd and Cu or their alloy.

The inter-layer dielectric film 230 can be formed on the gate electrode 212 and the gate line. The inter-layer dielectric film 230 can be formed of an inorganic film, for example, a silicon oxide film (SiOx), a silicon nitride film (SiNx), or a multi-layered film of the silicon oxide film and the silicon nitride film.

The source electrode 213, the drain electrode 214, the data line, and the first and second touch pads TP and RP can be formed on the inter-layer dielectric film 230. Each of the source electrode 213 and the drain electrode 214 can be connected to the active layer 211 through a contact hole that passes through the gate insulating film 220 and the inter-layer dielectric film 230. The source electrode 213, the drain electrode 214, the data line and the first and second touch pads RP and RP can be formed of a single layer or multi-layer comprised of any one of Mo, Al, Cr, Au, Ti, Ni, Nd and Cu or their alloy.

The passivation layer 240 can be formed on the source electrode 213, the drain electrode 214, the data line and the first and second touch pads TP and RP to insulate the thin film transistor 210. The passivation layer 240 can be formed of an inorganic film, for example, a silicon oxide film (SiOx), a silicon nitride film (SiNx), or a multi-layered film of the silicon oxide film and the silicon nitride film.

The planarization film 250 for planarizing a step difference due to the thin film transistor 210 can be formed on the passivation layer 240. The planarization film 250 can be formed of an organic film such as acrylic resin, epoxy resin, phenolic resin, polyamide resin, and polyimide resin.

The light emitting device layer 20 is formed on the thin film transistor layer 10. The light emitting device layer 20 includes light emitting devices and a bank 270.

The light emitting devices and the bank 270 are formed on the planarization film 250. Each of the light emitting devices includes the first electrode 261, the organic light emitting layer 262, and the second electrode 263. The first electrode 261 can be an anode electrode, and the second electrode 263 can be a cathode electrode.

The first electrode 261 can be formed on the planarization film 250. The first electrode 261 can be connected to the source electrode 213 of the thin film transistor 210 through a contact hole that passes through the passivation film 240 and the planarization film 250. The first electrode 261 can be formed of conductive material with high reflectivity such as a deposition structure (Ti/Al/Ti) of Al and Ti, a deposition structure (ITO/Al/ITO) of Al and ITO, an APC alloy, or a deposition structure (ITO/APC/ITO) of APC alloy and ITO. The APC alloy is an alloy of Ag, Pd and Cu.

The bank 270 can be formed on the planarization film 250 to partition the first electrode 261, thereby serving as a pixel defining film to define sub pixels SP. The bank 270 can be formed to cover an edge of the first electrode 261.

Each of the sub pixels P denotes an area where the first electrode 261 corresponding to the anode electrode, the light emitting layer 262, and the second electrode 263 corresponding to the cathode electrode are sequentially deposited and holes from the first electrode 261 and electrons from the second electrode 263 are combined with each other in the light emitting layer 262 to emit light.

The organic light emitting layer 262 is formed on the first electrode 261 and the bank 270. The organic light emitting layer 262 can be an organic light emitting layer for emitting a predetermined color including an organic material. If the organic light emitting layer 262 is a white light emitting layer for emitting white light, the organic light emitting layer 262 can be a common layer commonly formed for the pixels P. In this case, the organic light emitting layer 262 can be formed in a tandem structure of two stacks or more. Each of the stacks can include a hole transporting layer, at least one light emitting layer, and an electron transporting layer.

Also, a charge generating layer can be formed between the stacks. The charge generating layer can include an n type charge generating layer arranged to adjoin the lower stack, and a p type charge generating layer formed on the n type charge generating layer and arranged to adjoin the upper stack. The n type charge generating layer injects electrons into the lower stack, and the p type charge generating layer injects holes into the upper stack. The n type charge generating layer can be an organic layer of an organic host material doped with alkali metal such as Li, Na, K or Cs, or alkali earth metal such as Mg, Sr, Ba or Ra, wherein the organic host material has electron transporting capability. The p type charge generating layer can be an organic layer of an organic host material doped with a dopant, wherein the organic host material has hole transportation capability.

The second electrode 263 is arranged on the organic light emitting layer 262. The second electrode 263 can be formed to cover the organic light emitting layer 262. The second electrode 263 can be a common layer commonly formed for the pixels P.

The second electrode 263 can be formed of a transparent conductive material (TCO) such as ITO and IZO, which can transmit light, or a semi-transmissive conductive material such as Mg, Ag, and alloy of Mg and Ag. If the second electrode 263 is formed of a semi-transmissive conductive material, light emission efficiency can be enhanced by a micro cavity. A capping layer can be formed on the second electrode 263.

The encapsulation layer 300 is formed on the light emitting device layer 20. The encapsulation layer 30 includes an encapsulation film 280.

The encapsulation film 280 is arranged on the second electrode 263. The encapsulation film 280 can include at least one inorganic film and at least one organic film to prevent oxygen or water from being permeated into the light emitting layer 262 and the second electrode 263. For example, the encapsulation film 280 can include first and second inorganic films 281 and 283 and an organic film 282 interposed between the first and second inorganic films 281 and 283 as shown in FIGS. 6 and 7. Each of the first and second inorganic films 281 and 283 can be formed of a silicon nitride, an aluminum nitride, a zirconium nitride, a titanium nitride, a hafnium nitride, a tantalum nitride, silicon oxide, an aluminum oxide, or a titanium oxide. The organic film 282 can be formed with a sufficient thickness, for example, 7 μm to 8 μm, to prevent particles from being permeated into the light emitting layer 262 and the second electrode 263 by passing through the encapsulation film 280.

Since a flow of the organic film 282 is blocked by a dam 300, the organic film 282 can be formed inside the dam 300. By contrast, the first and second inorganic films 281 and 283 can be formed outside the dam 300. Also, the first and second inorganic films 281 and 283 can be formed so as not to cover the first and second touch pads RP.

A second buffer film 31 is formed on the encapsulation layer 30. The second buffer film 31 can be formed to cover the encapsulation film 280 and the first and second touch pads TP and RP. The second buffer film 31 can be formed of an inorganic film or an organic film. If the second buffer film 31 is formed of an inorganic film, the second buffer film 31 can be formed of a silicon oxide film (SiOx), a silicon nitride film (SiNx) or a multi-layered film of the silicon oxide film and the silicon nitride film.

A touch sensing layer 40 is formed on the second buffer film 31. The touch sensing layer 40 includes a first touch electrode layer 41, a second touch electrode layer 42, and a touch insulating film 43.

The first touch electrode layer 41 includes first and second touch electrodes 291 and 292. For example, the first and second touch electrodes 291 and 292 can be arranged on the same layer. The first and second touch electrodes 291 and 292 are spaced apart from each other, and are electrically insulated from each other. The second touch electrode layer 42 includes bridge electrodes 293. The touch insulating film 43 includes a touch inorganic film 294 and a touch organic film 295.

In more detail, the bridge electrodes 293 can be formed on the second buffer film 31. The bridge electrodes 293 can be formed of a single layer or multi-layer comprised of any one of Mo, Al, Cr, Au, Ti, Ni, Nd and Cu or their alloy.

The touch inorganic film 294 can be formed on the bridge electrodes 293. The touch inorganic film 294 can be formed of an inorganic film, for example, a silicon oxide film (SiOx), a silicon nitride film (SiNx) or a multi-layered film of the silicon oxide film and the silicon nitride film.

The touch organic film 295 can be formed on the touch inorganic film 294. The organic film 282 of the encapsulation film 280 is a particle cover layer for preventing particles from being permeated into the light emitting layer 262 and the second electrode 263 by passing through the encapsulation film 280, whereas the touch organic film 295 is a layer for spacing the first touch electrode layer 41 and the second touch electrode layer 42 apart from each other at a predetermined distance. Therefore, the touch organic film 295 can be formed at a thickness thinner than that of the organic film 282 of the encapsulation film 280. For example, the touch organic film 295 can be formed at a thickness of 2 μm, approximately. Also, since contact holes are not formed in the organic film 282 of the encapsulation film 280, the organic film 282 of the encapsulation film 280 does not need to include a photoresist material. By contrast, since contact holes are formed in the touch organic film 295, the touch organic film 295 can include a photoresist material. For example, the touch organic film 295 can be formed of a photo acrylate that includes a photoresist material.

The first touch electrodes 291 and the second touch electrodes 292 can be formed on the touch organic film 295. The first touch electrodes 291 can be connected with the bridge electrodes 293 through a first connector CT1 grown such that metal constituting the bridge electrodes 293 is plated into the contact hole that has passed through the touch inorganic film 294 and the touch organic film 295. For this reason, the first touch electrodes 291 are connected using the bridge electrodes 293 at the crossed areas of the first touch electrodes 291 and the second touch electrodes 292, the first touch electrodes 291 and the second touch electrodes 292 are not shorted mutually.

The first touch line TL can be extended from the first touch electrode 291, and the second touch line RL can be extended from the second touch electrode 292. The first touch line TL can be connected with the first touch pad TP through a second connector CT2 grown such that metal constituting the first touch pad TP is plated into the contact hole that has passed through the passivation film 240 and the buffer film 31. The second touch line RL can be connected with the second touch pad RP through a third connector CT3 grown such that metal constituting the second touch pad RP is plated by passing through the passivation film 240 and the buffer film 31.

The first touch electrodes 291, the second touch electrodes 292, the first touch lines TL and the second touch lines RL can be formed of a single layer or multi-layer comprised of any one of Mo, Al, Cr, Au, Ti, Ni, Nd and Cu or their alloy.

An overcoat layer 296 for planarizing a step difference, which may be caused by the first touch electrodes 291, the second touch electrodes 292 and the bridge electrodes 293, can be formed on the first touch electrodes 291 and the second touch electrodes 292.

Meanwhile, although FIG. 6 illustrates that the second touch electrode layer 42 is formed on the second buffer film 31, the touch insulating film 43 is formed on the second touch electrode layer 42, and the first touch electrode layer 41 is formed on the touch insulating film 43, the present invention is not limited to the example of FIG. 6. For example, the first touch electrode layer 41 can be formed on the second buffer film 31, the touch insulating film 43 can be formed on the first touch electrode layer 41, and the second touch electrode layer 42 can be formed on the touch insulating film 43.

A color filter layer can be formed on the touch sensing layer 40. The color filter layer can include color filters arranged to overlap the sub pixels SP and a black matrix arranged to overlap the bank 270. If the light emitting layer 262 includes organic light emitting layers for emitting red light, green light, and blue light, the color filter layer can be omitted.

An adhesive layer 50 is formed on the touch sensing layer 40. The adhesive layer 50 adheres the first substrate 111 and the second substrate 112 to each other, which are provided with the thin film transistor 10, the light emitting device layer 20, the encapsulation layer 30 and the touch sensing layer 40. The adhesive layer 50 can be an optically clear resin (OCR) or an optically clear adhesive film (OCA).

The second substrate 112 serves as a cover substrate or cover window for covering the first substrate 110. The second substrate 112 can be a plastic film, a glass substrate, or an encapsulation film (protective film).

As described above, according to one embodiment of the present invention, the first touch electrodes 291 can be connected with the bridge electrodes 293 through the first connector CT1 grown such that metal constituting the bridge electrodes 293 is plated into the contact hole that has passed through the touch inorganic film 294 and the touch organic film 295, the first touch line TL can be connected with the first touch pad TP through the second connector CT2 grown such that metal constituting the first touch pad TP is plated into the contact hole that has passed through the passivation film 240 and the buffer film 31, and the second touch line RL can be connected with the second touch pad RP through a third connector CT3 grown such that metal constituting the second touch pad RP is plated by passing through the passivation film 240 and the buffer film 31. Therefore, according to one embodiment of the present invention, the first touch electrodes 291, the first touch line TL and the second touch line RL can respectively be connected to the bridge electrodes 293, the first touch pad TP and the second touch pad RP without additional mask.

The first touch electrodes 291, the first touch line TL and the second touch line RL are provided using a first metal on the same layer. Also, the bridge electrode 293, the first touch pad TP and the second touch pad RP are provided using a second metal on the same layer. Therefore, if the first touch electrodes 291, the first touch line TL and the second touch line RL are sequentially formed and then connected with the bridge electrode 293, the first touch pad TP and the second touch pad RP, a separate mask process is required after the contact hole process.

In the embodiments of the present invention, growing is performed by metal plating through sidewalls of the connectors CT1 to CT3. The second metal for forming the bridge electrode 293, the first touch pad TP and the second touch pad RP of the present invention is a metal that can be grown through metal plating. Examples of the metal that can be grown through metal plating include Ni, Cu, etc. If a lower metal layer is formed using a metal that can be grown through metal plating, the lower metal layer can electrically be connected with an upper metal layer by ascending along a contact hole or an inclined surface even without a process using a separate mask.

The bridge electrode 293, the first touch pad TP and the second touch pad RP of the present invention are arranged in the contact hole at the same height as those of the first touch electrodes 291, the first touch line TL and the second touch line RL. Therefore, the bridge electrode 293, the first touch pad TP and the second touch pad RP are fully filled in the contact hole.

The first touch electrodes 291, the first touch line TL and the second touch line RL of the present invention are arranged to be spaced apart from one another at a portion connected with the bridge electrode 293, the first touch pad TP and the second touch pad RP. This is because that metal constituting the bridge electrode 293, the first touch pad TP and the second touch pad RP is grown into the contact hole using metal plating property after the first touch electrodes 291, the first touch line TL and the second touch line RL are first formed and then pass through the contact hole together with the touch inorganic film 294 and the touch organic film 295 or the passivation film 240 and the buffer film 31 when the contact hole is formed.

In this case, the number of masks used during the process can be reduced by at least 1 as compared with the case that the bridge electrode 293, the first touch pad TP and the second touch pad RP are first formed without using metal plating property and then the first touch lines TL and the second touch lines RL are formed. Therefore, the display apparatus with an integrated touch screen according to the present invention can reduce the fabricating cost.

Figure 8:
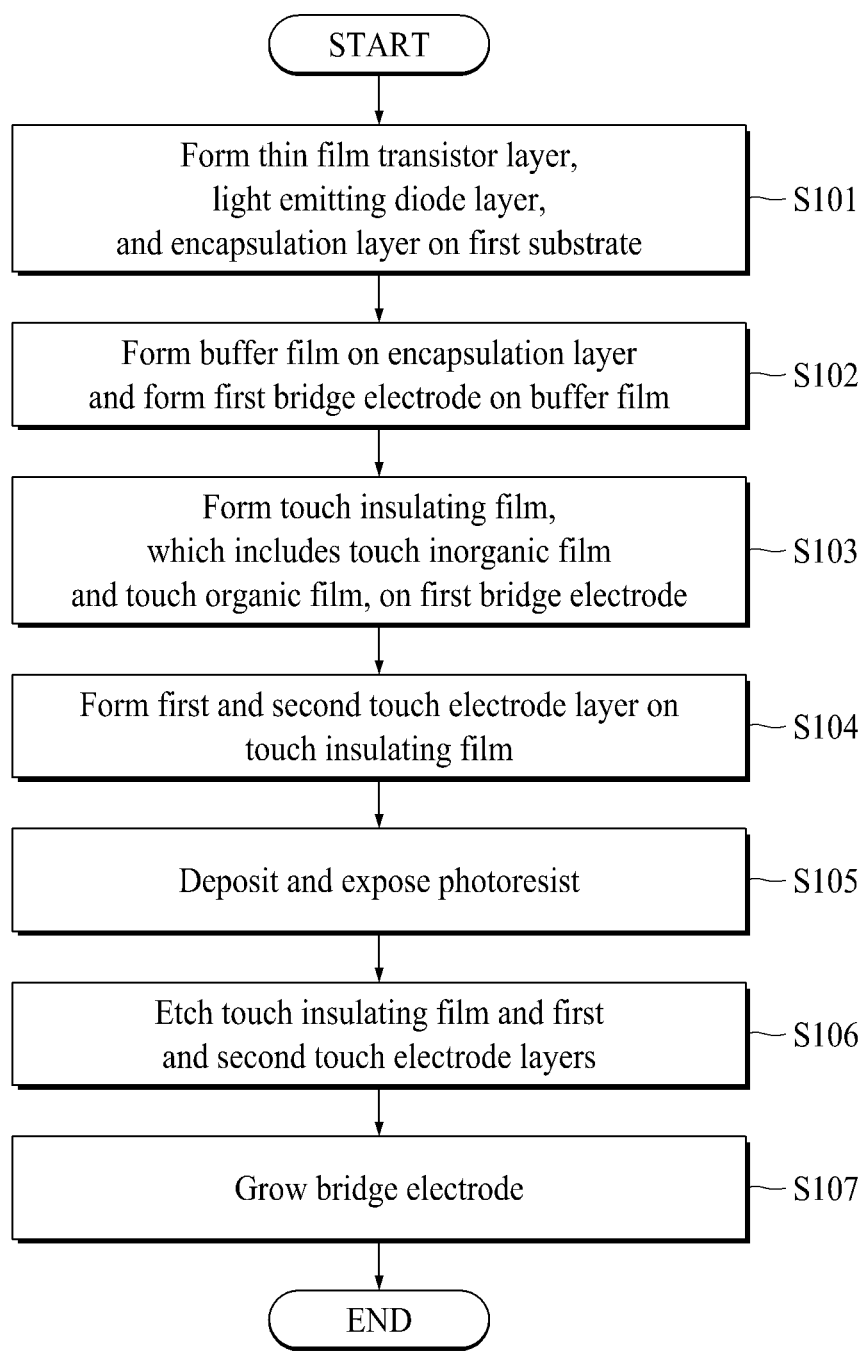
FIG. 8 is a flow chart illustrating a method for fabricating a display apparatus with an integrated touch screen according to one embodiment of the present invention.

FIG. 8 is a flow chart illustrating a method for fabricating a display apparatus with an integrated touch screen according to one embodiment of the present invention, and FIGS. 9 to 13 are cross-sectional views illustrating a method for fabricating a display apparatus with an integrated touch screen according to one embodiment of the present invention. It is to be noted that the sectional views of II-II' of FIG. 5, which are shown in FIG. 7, are shown in FIGS. 9 to 13.

Hereinafter, a method for fabricating a display apparatus with an integrated touch screen according to one embodiment of the present invention will be described in detail with reference to FIGS. 8 to 13.

Figure 9:
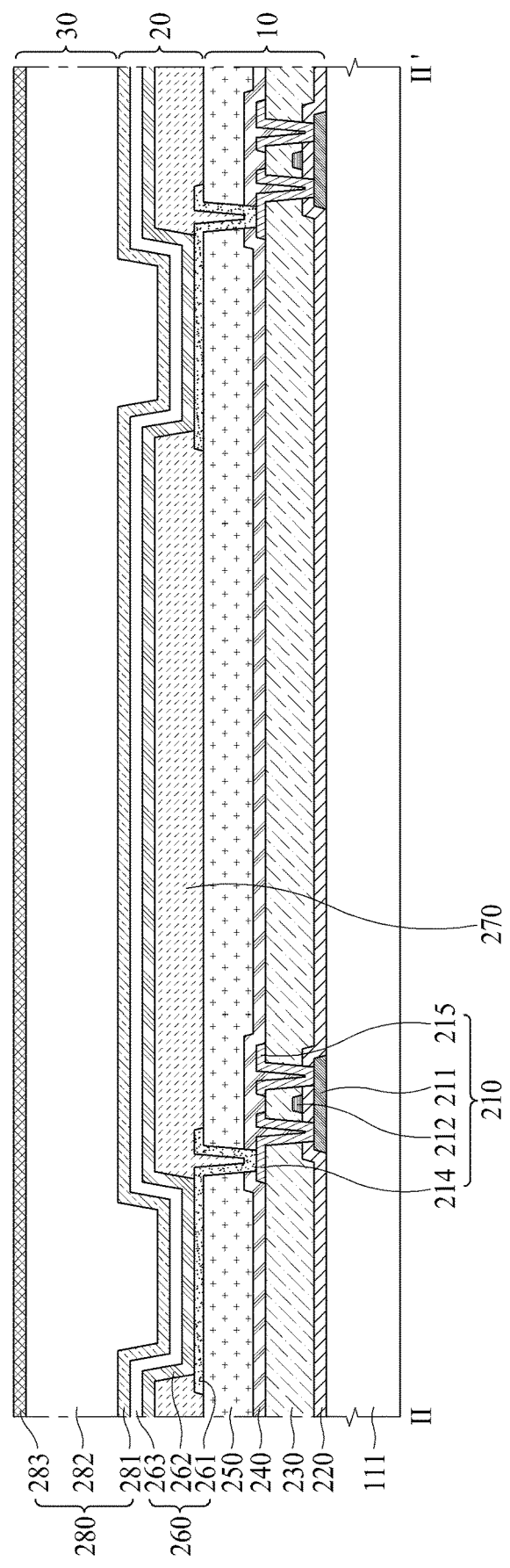
FIGS. 9 to 13 are cross-sectional views illustrating a method for fabricating a display apparatus with an integrated touch screen according to one embodiment of the present invention.

First of all, as shown in FIG. 9, the thin film transistor layer 10, the light emitting device layer 20 and the encapsulation layer 30 are formed on the first substrate 111 (S101).

In more detail, the first buffer film can be formed on the first substrate 111 from water permeated through the substrate 100 before the thin film transistor is formed. The first buffer film is intended to protect the thin film transistor 210 and the organic light emitting device 260 from water permeated through the first substrate 111 which is vulnerable to moisture permeability, and can be made of a plurality of inorganic films which are deposited alternately. For example, the first buffer film can be formed of a multi-layered film of one or more inorganic films of a silicon oxide film (SiOx), a silicon nitride film (SiNx) and SiON, which are deposited alternately. The first buffer film can be formed using a CVD (Chemical Vapor Deposition) method.

Afterwards, the active layer 211 of the thin film transistor is formed on the first buffer film. Specifically, an active metal layer is formed on the entire surface of the first buffer film using a sputtering method or a MOVCD (Metal Organic Chemical Vapor Deposition) method. Then, the active metal layer is patterned by a mask process using a photoresist pattern to form the active layer 211. The active layer 211 can be formed of a silicon based semiconductor material or an oxide based semiconductor material.

Then, the gate insulating film 220 is formed on the active layer 211. The gate insulating film 220 can be formed of an inorganic film, for example, a silicon oxide film (SiOx), a silicon nitride film (SiNx) or a multi-layered film of the silicon oxide film and the silicon nitride film.

Then, the gate electrode 212 of the thin film transistor 210 is formed on the gate insulating film 220. Specifically, a first metal layer is formed on the entire surface of the gate insulating film 220 using a sputtering method or a MOVCD (Metal Organic Chemical Vapor Deposition) method. Then, the first metal layer is patterned by a mask process using a photoresist pattern to form the gate electrode 212. The gate electrode 212 can be formed of a single layer or multi-layer comprised of any one of Mo, Al, Cr, Au, Ti, Ni, Nd and Cu or their alloy.

Then, the inter-layer dielectric film 230 is formed on the gate electrode 212. The inter-layer dielectric film 230 can be formed of an inorganic film, for example, a silicon oxide film (SiOx), a silicon nitride film (SiNx), or a multi-layered film of the silicon oxide film and the silicon nitride film.

Then, contact holes for exposing the active layer 211 by passing through the gate insulating film 220 and the inter-layer dielectric film 230 are formed.

Then, the source and drain electrodes 213 and 214 of the thin film transistor 210 are formed on the inter-layer dielectric film 230. Specifically, a second metal layer is formed on the entire surface of on the inter-layer dielectric film 230 using a sputtering method or a MOVCD (Metal Organic Chemical Vapor Deposition) method. Then, the second metal layer is patterned by a mask process using a photoresist pattern to form the source and drain electrodes 213 and 214. Each of the source and drain electrodes 213 and 214 can be connected to the active layer 211 through contact holes that pass through the gate insulating film 220 and the inter-layer dielectric film 230. The source and the drain electrodes 213 and 214 can be formed of a single layer or multi-layer comprised of any one of Mo, Al, Cr, Au, Ti, Ni, Nd and Cu or their alloy.

Then, the passivation film 240 is formed on the source and drain electrodes 213 and 214 of the thin film transistor 210. The passivation film 240 can be formed of an inorganic film, for example, a silicon oxide film (SiOx), a silicon nitride film (SiNx), or a multi-layered film of the silicon oxide film and the silicon nitride film. The passivation film 240 can be formed using a CVD method.

Then, the planarization film 250 for planarizing a step difference due to the thin film transistor 210 is formed on the passivation layer 240. The planarization film 250 can be formed of an organic film such as acrylic resin, epoxy resin, phenolic resin, polyamide resin, and polyimide resin.

Then, the first electrode 261 of the organic light emitting device layer 260 is formed on the planarization film 250. In more detail, a third metal layer is formed on the entire surface of the planarization film 250 using a sputtering method or a MOVCD (Metal Organic Chemical Vapor Deposition) method. Then, the third metal layer is patterned by a mask process using a photoresist pattern to form the first electrode 261. The first electrode 261 can be connected to the source electrode 223 of the thin film transistor 220 through a contact hole that passes through the passivation film 240 and the planarization film 250. The first electrode 261 can be formed of a conductive material with high reflectivity such as a deposition structure (Ti/Al/Ti) of Al and Ti, a deposition structure (ITO/Al/ITO) of Al and ITO, an APC alloy, or a deposition structure (ITO/APC/ITO) of APC alloy and ITO.

Then, in order to partition the sub pixels SP, the bank 270 is formed on the planarization film 250 to cover an edge of the first electrode 261. The bank 270 can be formed of an organic film such as acrylic resin, epoxy resin, phenolic resin, polyamide resin, and polyimide resin.

Then, the light emitting layer 262 is formed on the first electrode 261 and the bank 270. The light emitting layer 262 can be an organic light emitting layer. In this case, the organic light emitting layer 262 is formed on the first electrode 261 and the bank 270 by a deposition process or solution process. The organic light emitting layer 262 can be a common layer commonly formed for pixels P1, P2 and P3. In this case, the organic light emitting layer 262 can be formed of a white light emitting layer for emitting white light.

If the organic light emitting layer 262 is a white light emitting layer, the organic light emitting layer 262 can be formed in a tandem structure of two stacks or more. Each of the stacks can include a hole transporting layer, at least one light emitting layer, and an electron transporting layer.

Also, a charge generating layer can be formed between the stacks. The charge generating layer can include an n type charge generating layer arranged to adjoin the lower stack, and a p type charge generating layer formed on the n type charge generating layer and arranged to adjoin the upper stack. The n type charge generating layer injects electrons into the lower stack, and the p type charge generating layer injects holes into the upper stack. The n type charge generating layer can be an organic layer of an organic host material doped with alkali metal such as Li, Na, K or Cs, or alkali earth metal such as Mg, Sr, Ba or Ra, wherein the organic host material has electron transporting capability. The p type charge generating layer can be an organic layer of an organic host material doped with a dopant, wherein the organic host material has hole transportation capability.

Afterwards, the second electrode 263 is formed on the light emitting layer 262. The second electrode 263 can be a common layer commonly formed for the sub pixels SP. The second electrode 263 can be formed of a transparent conductive material (TCO) such as ITO and IZO, which can transmit light. The second electrode 263 can be formed by physics vapor deposition such as a sputtering method. A capping layer can be formed on the second electrode 263.

Afterwards, the encapsulation film 280 is formed on the second electrode 263. The encapsulation film 280 serves to prevent oxygen or water from being permeated into the light emitting layer 262 and the second electrode 263. To this end, the encapsulation film 280 can include at least one inorganic film 281 and 283. At least one inorganic film 281 and 283 can be formed of a silicon nitride, an aluminum nitride, a zirconium nitride, a titanium nitride, a hafnium nitride, a tantalum nitride, silicon oxide, an aluminum oxide, or a titanium oxide.

Also, the encapsulation film 280 can further include at least one organic film 282. The organic film 282 can be formed with a sufficient thickness to prevent particles from being permeated into the organic light emitting layer 262 and the second electrode 263 by passing through the encapsulation film 280.

Meanwhile, the process of forming at least one inorganic film 281 and 283 and the organic film 282 of the encapsulation film can be performed by a low temperature process of 100° C. or less to prevent the light emitting layer 262, which is already formed, from being damaged by a high temperature.

Figure 10:
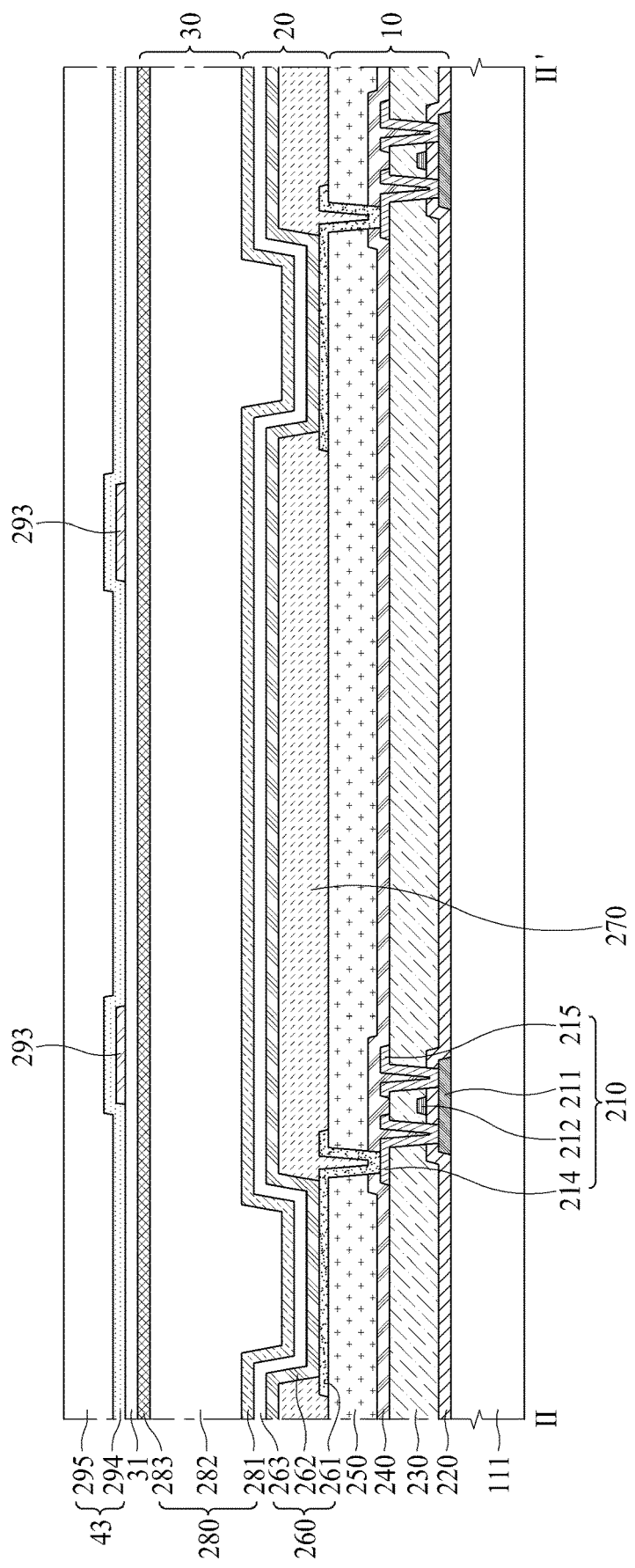

Secondly, as shown in FIG. 10, a second buffer film 31 is formed on the encapsulation layer 30. A second touch electrode layer 42 that includes the bridge electrodes 293 is formed on the second buffer film 31 (S102 of FIG. 8). Afterwards, a touch insulating film 43 that includes a touch inorganic film 294 and a touch organic film 295 is formed on the second touch electrode layer 42 (S103 of FIG. 8).

In more detail, the second buffer film 31 can be formed to cover the encapsulation film 280 and the first and second touch pads TP and RP. The second buffer film 31 can be formed of an inorganic film or an organic film. If the second buffer film 31 is formed of an inorganic film, the second buffer film 31 can be formed of a silicon oxide film (SiOx), a silicon nitride film (SiNx) or a multi-layered film of the silicon oxide film and the silicon nitride film. If the second buffer film 31 is formed of an organic film, the second buffer film 31 can be plasma treated to form a rough surface. In this case, since an area of the second buffer film 31 which is in contact with the bridge electrodes 293 of the first touch electrode layer 41 can be increased, surface adhesion between the second buffer film 31 and the bridge electrodes 293 of the first touch electrode layer 41 can be enhanced. Meanwhile, the process of forming the buffer film 31 can be performed by a low temperature process of 100° C. or less to prevent the light emitting layer 262, which is already formed, from being damaged by a high temperature.

Afterwards, a fourth metal layer is formed on the entire surface of the second buffer film 31 using a sputtering method or a MOVCD (Metal Organic Chemical Vapor Deposition) method. Then, the fourth metal layer is patterned by a mask process using a photoresist pattern to form the bridge electrodes 293. The bridge electrodes 293 can be formed of a multi-layered structure that includes a plurality of electrodes, for example, a three-layered structure of Ti/Al/Ti.

Then, the touch inorganic film 294 is formed on the second touch electrode layer 42. The touch inorganic film 294 can be formed of a silicon oxide film (SiOx), a silicon nitride film (SiNx) or a multi-layered film of the silicon oxide film and the silicon nitride film.

Then, the touch organic film 295 is formed on the touch inorganic film 294.

The organic film 282 of the encapsulation film 280 is a particle cover layer for preventing particles from being permeated into the light emitting layer 262 and the second electrode 263 by passing through the encapsulation film 280, whereas the touch organic film 295 is a layer for spacing the first touch electrode layer 41 and the second touch electrode layer 42 apart from each other at a predetermined distance. Therefore, the touch organic film 295 can be formed at a thickness thinner than that of the organic film 282 of the encapsulation film 280. For example, the touch organic film 295 can be formed at a thickness of 2 μm, approximately.

Afterwards, first connectors CT1 for exposing the bridge electrodes 293 are formed to pass through the touch inorganic film 294 and the touch organic film 295. Also, second connectors CT2 for exposing the first touch pads TP are formed to pass through the passivation film 240 and the buffer film 31, and third connectors CT3 for exposing the second touch pads RP are formed to pass through the passivation film 240 and the buffer film 31.

Since contact holes are not formed in the organic film 282 of the encapsulation film 280, the organic film 282 of the encapsulation film 280 does not need to include a photoresist material. By contrast, since contact holes are formed in the touch organic film 295, the touch organic film 295 can include a photoresist material. For example, the touch organic film 295 can be formed of a photo acrylate that includes a photoresist material.

Meanwhile, the process of forming the touch inorganic film 294 and the touch organic film 295 can be performed by a low temperature process of 100° C. or less to prevent the light emitting layer 262, which is already formed, from being damaged by a high temperature.

Figure 11:
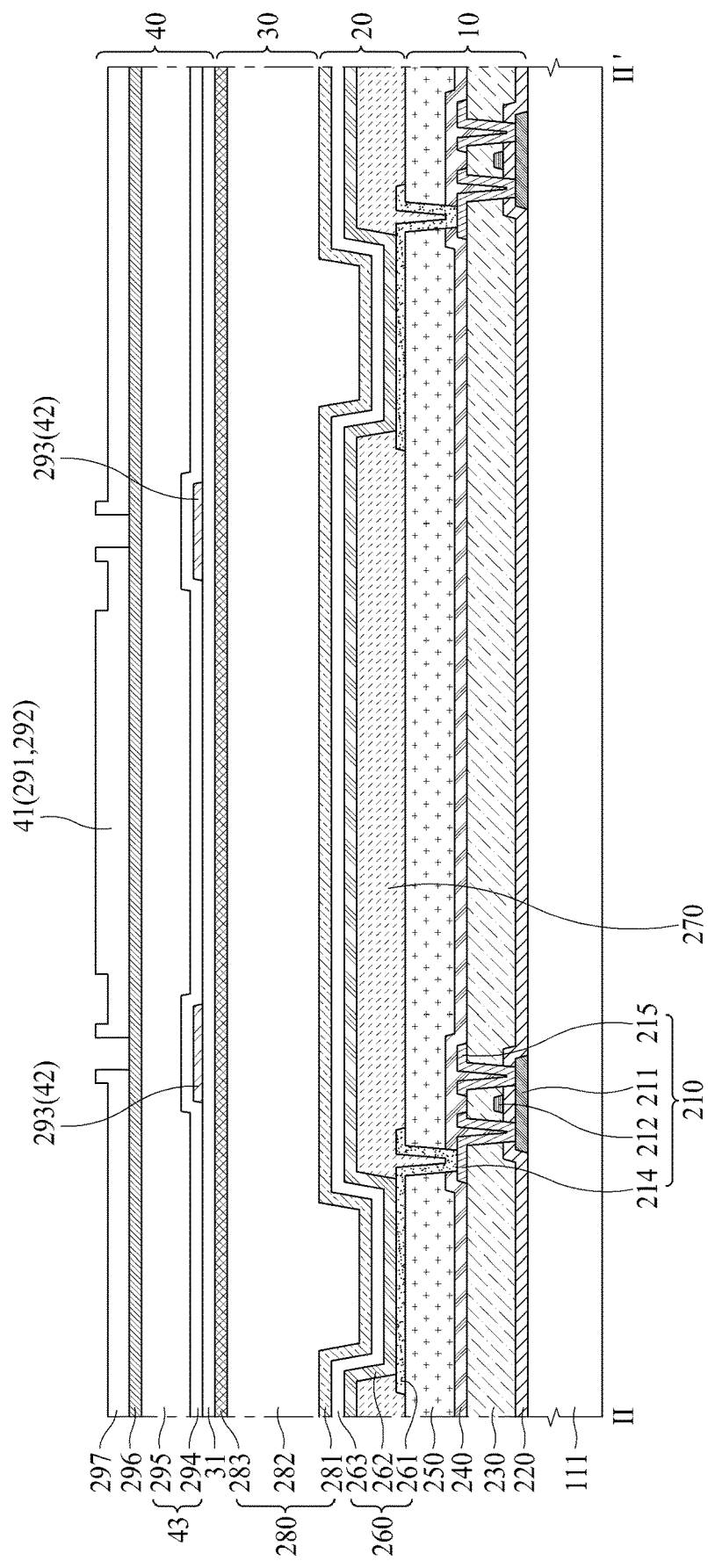

Thirdly, as shown in FIG. 11, the first touch electrode layer 41 that includes the first touch electrodes 291 and the second touch electrodes 292 is formed on the touch insulating film 43 (S104 of FIG. 8). Afterwards, a photoresist layer 297 is formed and then exposed (S105 of FIG. 8).

In more detail, the first touch electrodes 291 and the second touch electrodes 292 are formed on the entire surface of the touch insulating film 43 using a sputtering method or MOCVD method. Each of the first touch electrodes 291 can be connected with the bridge electrodes 293 through the first connector CT1 that passes through the touch inorganic film 294 and the touch organic film 295. The first touch electrodes 291 and the second touch electrodes 292 can be formed in a multi-layered structure that includes a plurality of electrodes, for example, a three-layered structure of Ti/Al/Ti.

The first touch line TL can be extended from the first touch electrode 291, and the second touch line RL can be extended from the second touch electrode 292. The first touch line TL can be connected with the first touch pad TP through the second connector CT2 that passes through the passivation film 240 and the buffer film 31. The second touch line RL can be connected with the second touch pad RP through the third connector CT3 that passes through the passivation film 240 and the buffer film 31.

The first touch electrodes 291, the second touch electrodes 292, the first touch lines TL and the second touch lines RL can be formed of a single layer or multi-layer comprised of any one of Mo, Al, Cr, Au, Ti, Ni, Nd and Cu or their alloy.

Also, an overcoat layer 296 for planarizing a step difference caused by the first touch electrodes 291, the second touch electrodes 292 and the bridge electrodes 293 can be formed on the first touch electrodes 291 and the second touch electrodes 292.

Also, a color filter layer can be formed on the touch sensing layer 40. The color filter layer can include color filters arranged to overlap the sub pixels SP and a black matrix arranged to overlap the bank 270. If the light emitting layer 262 includes organic light emitting layers for emitting red light, green light, and blue light, the color filter layer can be omitted.

Afterwards, a photoresist layer 297 is formed and then exposed. Whether a lower layer below the photoresist layer 297 is etched is determined depending on arrangement of the photoresist layer 297. For example, if the photoresist layer 297 serves to block exposure of the lower layer, the area where the photoresist layer 297 is arranged can allow the lower layer not to be etched, and the area where the photoresist layer 297 is not arranged can allow the lower layer to be etched.

Also, if the photoresist layer 297 is not arranged, a metal layer arranged at an upper portion and a nonmetallic insulating layer or inorganic film arranged below the metal layer are all removed through an etching process of twice. However, if the photoresist layer 297 is formed of a half tone, the metal layer arranged at the upper portion is only removed after the etching process of twice, and the nonmetallic insulating layer or inorganic film arranged below the metal layer can be maintained.

Figure 12:
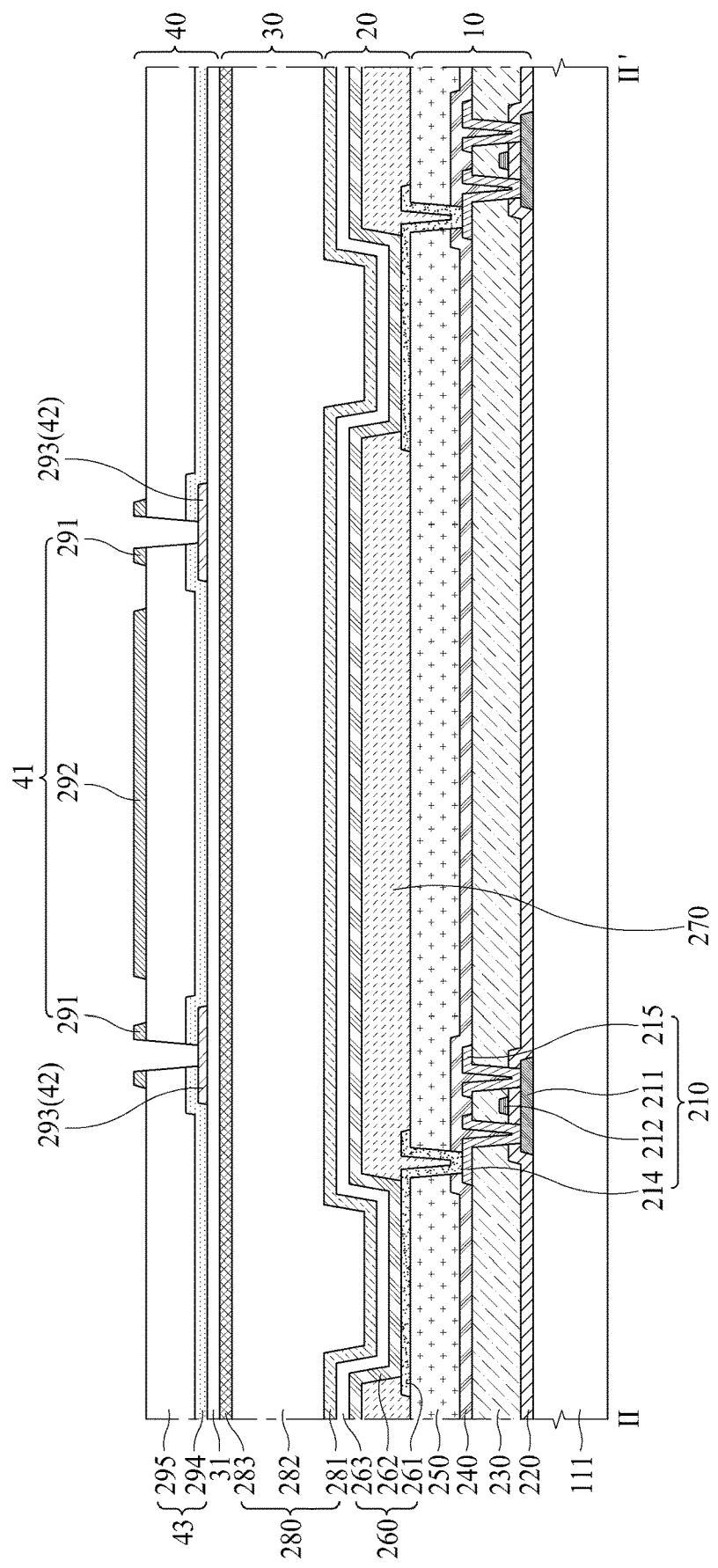

Fourthly, as shown in FIG. 12, the touch insulating film that includes the touch inorganic film 294 and the touch organic film 295, and the first and second touch electrode layers 291 and 292 are etched (S106 of FIG. 8). The etching process can be performed by carrying out dry etching twice.

The first etching process is to prepare a contact hole for forming the first connector CT1. An etching solution used for the first etching process can etch all of the photoresist layer 297, the touch insulating film that includes the touch inorganic film 294 and the touch organic film 295, and the first and second touch electrode layers 291 and 292. Therefore, the touch insulating film, which includes the touch inorganic film 294 and the touch organic film 295, of the area where the photoresist layer 297 is not formed, and the first and second touch electrode layers 291 and 292 are all etched during the first etching process. The photoresist layer 297 is removed from the area where the photoresist layer 297 is formed of a halftone, and the photoresist layer 297 remains as a halftone in the area where the photoresist layer 297 is formed at an average thickness.

The second etching process is performed to pattern the first and second touch electrode layers 291 and 292. An etching solution used for the second etching process can etch the photoresist layer 297 and the first and second touch electrode layers 291 and 292, and the touch insulating film that includes the touch inorganic film 294 and the touch organic film 295 is not etched. Therefore, in case of the second etching process, since the photoresist layer 297 is removed from the area where the photoresist layer 297 is first formed of a halftone, the first and second touch electrode layers 291 and 292 are removed, and the photoresist layer 297 remains as a halftone in the area where the photoresist layer 297 is formed at an average thickness, whereby the photoresist layer 297 is only removed.

As a result, the first touch electrodes 291, the second touch electrodes 292, the touch inorganic film 294 and the touch organic film 295 are all maintained in the area where the photoresist layer 297 is formed at an average thickness, during a later etching process. Also, the first touch electrodes 291 and the second touch electrodes 292 are removed in the area where the photoresist layer 297 is formed of a halftone, during the later etching process, and the touch inorganic film 294 and the touch organic film 295 are maintained. Also, the first touch electrodes 291, the second touch electrodes 292, the touch inorganic film 294 and the touch organic film 295 are all removed in the area where the photoresist layer 297 is not formed, during the later etching process. Therefore, according to the present invention, the first touch electrodes and the second touch electrodes 292 can remain in a desired area only, or can be formed to be patterned.

Figure 13:
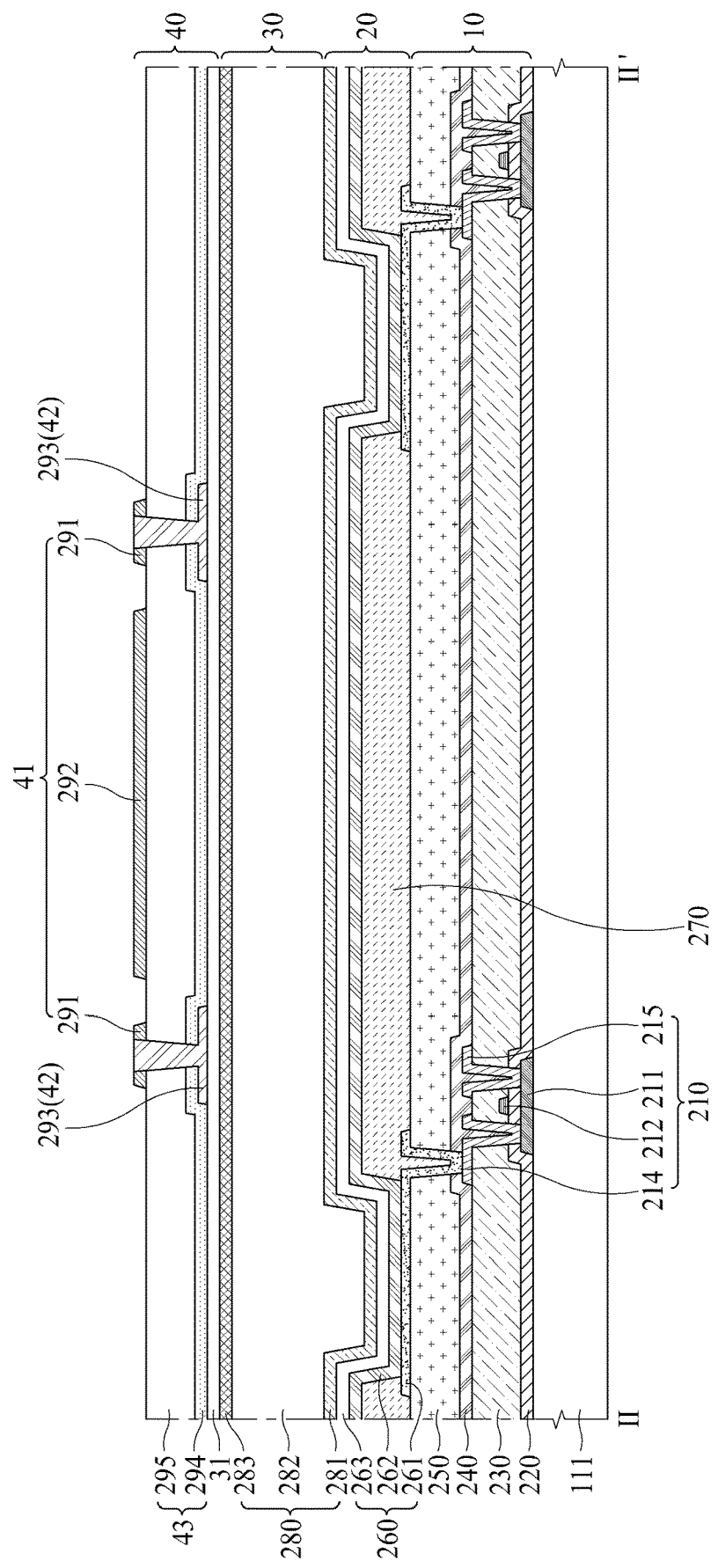

Fifthly, as shown in FIG. 13, the bridge electrodes 293 are grown and then connected with the first touch electrode layer 41 (S107 of FIG. 8). The bridge electrodes 293 are grown through metal plating. Metal plating preferably can mean that specific metals can ascend along a wall of a unit size of 1 nm to 600 nm (or approximately thereof), such as a contact hole, within the wall or space.

The bridge electrodes 293 according to the embodiments of the present invention are made of a metal that can be grown through metal plating. Examples of the metal that can be grown through metal plating include Ni, Cu, etc. If the bridge electrodes are formed using a metal that can be grown through metal plating, the bridge electrodes 293 can electrically be connected with the first touch electrode 291 at an upper portion by ascending along a contact hole or an inclined surface even without a process using a separate mask.

The bridge electrodes 293 are grown through plating while ascending along the sidewall of the first connector CT1. The bridge electrodes 293 can be connected with the first touch electrodes 291 in the first connector CT1 while being grown. The bridge electrodes 293 can be connected with the first touch electrodes 291 without a separate deposition process.

The bridge electrodes 293, the first touch pad TP and the second touch pad RP of the present invention are arranged in the first connector CT1 at the same height as that of the first touch electrodes 291. The bridge electrodes 293 are fully filled in the first connector CT.

The first touch electrodes 291 according to the embodiments of the present invention are arranged to be spaced apart from one another at a portion connected with the bridge electrodes 293. This is because that metal constituting the bridge electrodes 293 is grown into the first connector CT1 using metal plating property and connected with the first touch electrodes 291 after the first touch electrodes 291 are first formed and then pass through the first connector together with the touch inorganic film 294 and the touch organic film 295 when the first connector CT1 is formed.

In this case, the number of masks used during the process can be reduced by at least one 1 as compared with the case that the bridge electrodes 293 are first formed without using metal plating property and then the first touch electrode 291 is formed. Therefore, the display apparatus with an integrated touch screen according to the embodiments of the present invention can reduce the fabricating cost.

Therefore, the method for fabricating the display apparatus with an integrated touch screen, which can connect the bridge electrodes with the touch electrodes, can be provided without a separate mask process.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A display apparatus comprising:
a light emitting device layer that includes a first electrode arranged on a first substrate, a light emitting layer arranged on the first electrode, and a second electrode arranged on the light emitting layer;
an encapsulation layer on the light emitting device layer; and
a touch sensing layer arranged on the light emitting device layer,
wherein the touch sensing layer includes a first touch electrode layer, a second touch electrode layer and a touch insulating film arranged between the first and second touch electrode layers,
wherein the first touch electrode layer constitutes a first touch electrode and a second touch electrode, and the second touch electrode layer constitutes bridge electrodes and fills a first contact hole provided in the touch insulating film and connected with the first touch electrode layer, and
wherein the first contact hole penetrates through both of the first touch electrode and the touch insulating film.

2. The display apparatus of claim 1, wherein the touch insulating film includes a touch inorganic film and a touch organic film,
wherein the first touch electrode is connected with the bridge electrodes through a first connector filled with metal constituting the bridge electrodes into the first contact hole, and
wherein the first contact hole penetrates through both of the touch inorganic film and the touch organic film.

3. The display apparatus of claim 2, wherein the first touch electrode layer is arranged to be spaced from the first connector by the bridge electrodes.

4. The display apparatus of claim 1, wherein the second touch electrode layer is grown through metal plating along a sidewall of the first contact hole.

5. The display apparatus of claim 1, wherein the bridge electrodes are arranged at the same height as that of the first touch electrode layer.

6. The display apparatus of claim 1, further comprising:
a first touch line extended from the first touch electrode; and
a second touch line extended from the second touch electrode,
wherein the first touch line is connected to a first touch pad through a second connector provided on the first substrate, and
wherein the second touch line is connected to a second touch pad through a third connector provided on the first substrate.

7. The display apparatus of claim 6, wherein the second connector is filled with metal constituting the first touch pad into a second contact hole that has passed through a passivation film and a buffer film provided on the first substrate, and
wherein the third connector is filled with metal constituting the second touch pad into a third contact hole that has passed through the passivation film and the buffer film provided on the first substrate.

8. The display apparatus of claim 1, further comprising:
a plurality of sub-pixels; and
a bank disposed between two adjacent sub-pixels among the plurality of sub-pixels,
wherein one of the bridge electrodes is disposed on the bank without overlapping an active area of any of the two adjacent sub-pixels.

9. The display apparatus of claim 8, wherein each of the first and second touch electrodes has a mesh structure, and
wherein the one of the bridge electrodes includes a corner portion overlapping with an intersection portion in the mesh structure of the second touch electrode.

10. The display apparatus of claim 1, wherein each of the first and second touch electrodes has a mesh structure.

11. The display apparatus of claim 1, wherein the encapsulation layer is disposed between the light emitting device layer and the touch sensing layer,
wherein each of the bridge electrodes includes:
a base portion disposed between the touch insulating film and the encapsulation layer, and
a connector portion disposed on the base portion, and
wherein the connector portion contacts the first touch electrode and has a reverse tapered shape relative to the base portion.

12. A method for fabricating a display apparatus, the method comprising:
forming a thin film transistor layer, a light emitting device layer, and an encapsulation layer on a first substrate;
forming a second touch electrode layer, which includes bridge electrodes, on the encapsulation layer and then forming a touch insulating film, which includes a touch inorganic film and a touch organic film, on the second touch electrode layer;
forming a first touch electrode layer, which includes a first touch electrode and a second touch electrode, on the touch insulating film, and forming a photoresist layer and then exposing the photoresist layer;
etching the touch insulating film, the first touch electrode layer and the second touch electrode layer; and
growing the bridge electrodes and connecting the bridge electrodes with the first touch electrode layer,
wherein the etching includes forming a first contact hole that penetrates through both of the first touch electrode and the touch insulating film, and
wherein the growing the bridge electrodes includes filling the first contact hole with conductive material, the conductive material being disposed on the bridge electrodes formed on the encapsulation layer.

13. The method of claim 12, wherein the first touch electrode is connected with the bridge electrodes by growing metal constituting the bridge electrodes into the first contact hole that has passed through the touch insulating film, in a connector.

14. The method of claim 12, wherein the growing of the bridge electrodes is performed by metal plating through a sidewall of a connector formed by the etching of the touch insulating film, the first touch electrode layer and the second touch electrode layer.

15. The method of claim 12, wherein the bridge electrodes are arranged in a connector formed by the etching of the touch insulating film, the first touch electrode layer and the second touch electrode layer at the same height as that of the first touch electrode layer.

16. The method of claim 12, wherein the first touch electrode layer is arranged to be spaced from a connector, which is formed by the etching of the touch insulating film, the first touch electrode layer and the second touch electrode layer, by the bridge electrodes.

\* \* \* \* \*